(12) United States Patent
Hiraga

(10) Patent No.: US 7,154,720 B2
(45) Date of Patent: Dec. 26, 2006

(54) SEMICONDUCTOR INTEGRATED CIRCUIT DEVICE WITH ENHANCED RESISTANCE TO ELECTROSTATIC BREAKDOWN

(75) Inventor: Noriaki Hiraga, Yokohama (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/257,236

(22) Filed: Oct. 25, 2005

(65) Prior Publication Data

US 2006/0061926 A1   Mar. 23, 2006

Related U.S. Application Data

(62) Division of application No. 10/642,345, filed on Aug. 18, 2003, now Pat. No. 6,972,938, which is a division of application No. 09/625,643, filed on Jul. 25, 2000, now Pat. No. 6,927,956.

(30) Foreign Application Priority Data

Jul. 28, 1999  (JP)  ............ 11-213098
Jul. 28, 1999  (JP)  ............ 11-213123

(51) Int. Cl.
  *H02H 3/20*  (2006.01)
  *H02H 9/00*  (2006.01)
(52) U.S. Cl. ............... 361/56; 361/111; 361/91.1; 361/91.5
(58) Field of Classification Search ............ 361/56, 361/111, 91.1, 91.5; 326/62–92; 307/333
   See application file for complete search history.

(56) References Cited

U.S. PATENT DOCUMENTS 5,548,135 A   8/1996  Avery ............ 257/173
5,784,235 A   7/1998  Otomo et al. ............ 361/56
5,828,108 A   10/1998  Toyoda ............ 257/372
5,886,862 A * 3/1999  Anderson et al. ............ 361/56
5,923,570 A   7/1999  Shigemoto ............ 364/491
5,952,684 A   9/1999  Tashiro ............ 257/207
5,991,134 A   11/1999  Tan et al. ............ 361/56
6,339,234 B1  1/2002  Takizawa ............ 257/203

FOREIGN PATENT DOCUMENTS

JP  02-192760    7/1990
JP  07-022617    1/1995
JP  P 08-037238  2/1996
JP  11-505374    5/1999

* cited by examiner

*Primary Examiner*—Brian Sircus
*Assistant Examiner*—Z Kitov
(74) *Attorney, Agent, or Firm*—Morgan, Lewis, & Bockius, LLP

(57) ABSTRACT

A semiconductor integrated circuit device having a plurality of internal circuits connected to different power lines, and an inter-circuit signal wire or a branched wire along these internal circuits, wherein near an active element in a first connection configuration connected to the inter-circuit signal wire or the like, a plurality of active elements in another connection configuration are arranged to sandwich or surround the active element in the first connection configuration. The active elements in the other connection configuration have the identical or similar structure to the active element in the first connection configuration, and are connected to power lines of an internal circuit associated therewith but not connected to signal wires and so on in the internal circuit.

16 Claims, 11 Drawing Sheets

SEMICONDUCTOR INTEGRATED CIRCUIT DEVICE WITH ENHANCED RESISTANCE TO ELECTROSTATIC BREAKDOWN

This application is a Divisional of U.S. patent application Ser. No. 10/642,345, filed Aug. 18, 2003 now U.S. Pat. No. 6,972,938, and which is a Divisional of U.S. patent application Ser. No. 09/625,643, filed Jul. 25, 2000, now U.S. Pat. No. 6,927,956, and claims the benefit of Japanese application No. 11-213098, filed Jul. 28, 1999, and Japanese application No. 11-213123, filed Jul. 28, 1999, all of which are hereby incorporated by reference.

BACKGROUND OF THE INVENTION

1. Field of the Invention

The present invention relates generally to semiconductor integrated circuit devices having a plurality of internal circuits having different supply voltages, and more particularly to the technology for protecting active elements in such internal circuits from failure due to electrostatic discharge or the like.

The semiconductor integrated circuit devices directed by the present invention may include a multi-functional LSI (large scaled integrated circuit device), a digital/analog hybrid LSI, a digital LSI for multi-power supply, to name a few.

2. Description of Technical Background

FIGS. 10A and 10B illustrate a typical layout of a semiconductor integrated circuit device, fabricated on a single chip, which has a plurality of internal circuits using different power lines, wherein FIG. 10A is a schematic diagram generally illustrating the layout of the chip, and FIG. 10B is a circuit diagram of a main portion. FIGS. 11A to 11E illustrate at an element level portions of the internal circuits which communicate signals therebetween, wherein FIG. 11A is a detailed circuit diagram; FIG. 11B is a layout diagram of semiconductor regions; FIG. 11C is a layout diagram of the semiconductor regions in which gates and power lines have also been patterned; FIG. 11D is a layout diagram of the semiconductor regions in which signal wires have further been patterned; and FIG. 11E is a vertically sectioned perspective view illustrating a semiconductor region and a gate which constitute a basic cell or a basic unit for an active element. It should be noted that in FIG. 11D, thick solid lines indicate signal wires; black circles indicate connections such as contact holes at which signal wires extend deep into a semiconductor layer; and small squares indicate connections at which signal wires extend into a power line layer but not to the underlying semiconductor layer. The same legends are applied to FIGS. 1B, 2B, 4B, 5B and 8A, later described.

The generalization of manufacturing processes, automated designs and so on have been developed for large scaled integrated circuits, which are applied in a wide variety of products, for example, gate arrays, custom LSIs, ASICs (Application Specific IC), and so on, on the assumption of the common utilization of basic cell structures, regular layouts and so on. In many cases, external connection terminals, external signal input/output circuits, and internal circuits are arranged in order from the periphery to the center of a semiconductor integrated circuit device. As described herein as a typical example, a semiconductor integrated circuit device 1 (see FIG. 10A) includes an internal circuit 4A and an internal circuit 4B which are supplied with different supply voltages, so that these internal circuits 4A, 4B are positioned separately in a left-hand and a right-hand block. Also, a left-hand external signal input/output circuit 3A and some external connection terminals 2 on the left side, located near the left-hand internal circuit 4A, are generally connected to the internal circuit 4A, and are adapted to relay signals associated with the internal circuit 4A to the outside and to supply power to the internal circuit 4A. Remaining external signal input/output circuit 3B and external connection terminals 2, in turn, are generally connected to the internal circuit 4B, and are adapted to relay signals associated with the internal circuit 4B to the outside and to supply power to the internal circuit 4B.

A variety of combinations of supply voltages fed to these internal circuits 4A, 4B may be contemplated, for example, 12 volts and 5 volts; 5 volts and 3 volts; 3 volts and 2 volts, and so on. In the drawings, circuits fed with a relatively higher supply voltage (left-hand ones in FIG. 10A), elements contained therein, and so on are designated by reference numerals followed by "A," while circuits fed with a relatively lower supply voltage (right-hand ones in FIG. 10B), elements contained therein, and so on are designated by reference numerals followed by "B." The same rule is applied also to FIGS. 12A to 12C and FIGS. 1A to 9, later described.

In such combinations, powering of the internal circuit 4A from the outside requires at least one pair of power lines, for example, a power line 8A for applying a positive voltage and a power line 9A for grounding, so that at least one of multiple external connection terminals 2 is assigned as a high power terminal 5A which is connected to the one power line 8A, and at least one of the remaining external connection terminals 2 is assigned as a ground terminal 6A which is connected to the other power line 9A. The power lines 8A, 9A individually extend as circular, tree-like, or stripe wires (see FIG. 10A), not shown, and are connected to an input protection circuit 3AA in the external signal input/output circuit 3A, and are further routed therethrough to the internal circuit 4A in which they are also connected to multiple internal elements 11A, 12A, 13A (see FIG. 10B).

The input protection circuit 3AA (see FIG. 10B) is provided for a connection line which connects an input/output terminal 7A assigned to an input to the internal element 11A or the like of the external connection terminals 2 to a connection line with the internal element 11A. Typically, the input protection circuit 3AA may be composed of a pair or a set of rectifying elements such as diodes, transistors or the like, connected to the connection line and to the power lines 8A, 9A. If surge noise (ESD surge: Electrostatic Discharge) such as static electricity introduces into the input/output terminal 7A, the input protection circuit 3AA forces the surge noise to escape to the high power terminal SA or the ground terminal 6A to protect the internal element 11A from the surge noise.

Likewise, in the internal circuit 4B (see FIGS. 10A, 10B), although repetitive details are omitted, a power line 8B for applying a positive voltage lower than that of the power line 8A is routed from a lower power terminal 5B through an external signal input/output circuit 3B to the internal circuit 4B, while a power line 9B for grounding, forming a pair with the power line 8B, is likewise routed from a ground terminal through the external signal input/output circuit 3B to the internal circuit 4B. These lines are connected to an input protection circuit 3BB in the external signal input/output circuit 3B, as well as to internal elements 11B, 12B, 13B in the internal circuit 4B, and a connection line from the input/output terminal 7B to the internal element 11B is connected to the input protection circuit 3BB. All of these power lines or at least the power lines 8A, 8B may be indirectly connected through the protection circuit or the like but will never be directly connected or short-circuited within the semiconductor integrated circuit device 1, so that the internal circuit 4A, 4B act as a plurality of individual internal circuits using different power lines.

Further, as can be seen in FIG. 10B, for communicating signals between the internal circuits 4A, 4B, inter-circuit signal wires 12 for interconnecting the output element 12A of the internal circuit 4A and the input element 12B of the internal circuit 4B, and inter-circuit signal wires 13 for interconnecting the output element 13B of the internal circuit 4B and the input element 13A of the internal circuit 4A are also routed between the internal circuits 4A, 4B as many number of lines as required for communicating signals.

The output element 12A may comprise a single or a plurality of active elements such as transistors. For example, if the output element 12A is a CMOS inverter (see FIG. 11A), the output element 12A includes a p-type MOS (hereinafter called the "pMOS") transistor 12AP having a source connected to the power line 8A, a drain connected to the inter-circuit signal wire 12, and a gate connected to an internal signal wire SA within the internal circuit 4A; and an n-type MOS (hereinafter called the "nMOS") transistor 12AN having a source connected to the power line 9A, a drain connected to the inter-circuit signal wire 12, and a gate connected to the internal signal wire SA within the internal circuit 4A. The input element 12B also includes a pair of transistors, pMOS transistor 12BP and NMOS transistor 12BN, having their sources connected to the power lines 8B, 9B, respectively, which have their gates connected to the inter-circuit signal wire 12, and their drains connected to an internal signal wire SB within the internal circuit 4B.

The input element 13A and the output element 13B, though signals are communicated in directions opposite to each other, each includes a similar transistor pair consisting of one pMOS transistor (13AP, 13BP) and one nMOS transistor (13AN, 13BN), with their drains or gates connected to the inter-circuit signal wire 13.

Each of the transistors 12AP, 12AN, 12BP, 12BN (and the transistors 13AP, 13AN, 13BP, 13BN) is an active element connected to the inter-circuit signal wires in a first connection configuration. Then, for fabricating the semiconductor integrated circuit device 1 having the circuits as mentioned above on a silicon wafer or the like (see FIGS. 11B to 11E), miniature basic cells for active elements are repeatedly arranged at regular pitches in the vertical and horizontal directions in regions allocated to the internal circuits 4A, 4B in each chip. For example, a basic cell for a CMOS (see FIG. 11B) is composed of an nMOS cell and a pMOS cell. The NMOS cells are distributed on a p-type substrate (p-Sub) in the form of island, and an n-type semiconductor region, a gate oxide film region, and an n-type semiconductor region may be formed for each of the cells. Alternatively, n-type semiconductor regions, gate oxide film regions, n-type semiconductor regions, gate oxide film regions and n-type semiconductor regions may often be previously formed as illustrated, and a central n-type semiconductor region is shared to fabricate two n-type MOS transistors.

The pMOS cells, in turn, are distributed likewise in the form of island in a n-type well region (n-Well) and positioned to establish a one-to-one correspondence to the nMOS cells, and are implemented by replacing the n-type semiconductor region in the nMOS cells with a p-type semiconductor region. Then, on a gate oxide film region of each basic cell, an isolated pattern made of a metal or the like is individually formed to provide a gate and its lead-out (see FIG. 11E). Further, another conductive layer made of a metal, overlying a suitable insulating layer or the like interposed therebetween, is patterned to form the power line 8A on a sequence of pMOS basic cells in the internal circuit 4A; the power line 9A on a sequence of nMOS basic cells in the internal circuit 4A; the power line 8B on a sequence of pMOS basic cells in the internal circuit 4B; and the power line 9B on a sequence of NMOS basic cells in the internal circuit 4B (see FIG. 11C).

In this way, the basic cells for active elements are regularly arranged in the same structure or similar structure until the midway of pre-processing of the semiconductor process to provide highly generalized wafers.

Subsequently, as a specific allocation of active elements is determined based on a particular application, for example, the active elements 12AP, 12AN in the first connection configuration are allocated to adjacent basic cells in the internal circuit 4A (see FIG. 11C), while the active elements 12BP, 12BN in the first connection configuration are likewise allocated to adjacent basic cells in the internal circuit 4B. Consequently, necessary wires associated with these active elements are substantially uniquely determined in the following manner.

Specifically, as can be seen in FIG. 11D, basic cells of interest are formed with contact holes (see a black line in FIG. 11D) such as via holes at the centers thereof to connect the sources of the active elements 12AP, 12AN, 12BP, 12BN in the first connection configuration to the power lines 8A, 9A, 8B, 9B, respectively. In the internal circuit 4A, the internal signal wire SA is connected to the gate of the active element 12AP in the first connection configuration as well as to the gates of both the active elements 12AP, 12AN in the first connection configuration. Also, one end of the inter-circuit signal wire 12 is branched and connected to the drains of the active elements 12AP, 12AN in the first configuration at corners of the basic cells.

The other end of the inter-circuit signal wire 12 extends into the internal circuit 4B and is connected to the gate of the active element 12BP in the first connection configuration. In the internal circuit 4B, the active elements 12BP, 12BN in the first connection configuration have their gates connected to each other. The internal signal wire SB has its one end branched and connected to the drains of the active elements 12BP, 12BN in the first connection configuration at corners of the basic cells. The branched signal wires are again joined and connected to another internal element or the like in the internal circuit 4B.

In this way, the basic semiconductor parts are generalized and utilized in common, and a variety of circuits are implemented by changing the allocation of active elements, determined subsequent to the formation of the basic semiconductor parts, and the wiring formed on an overlying layer and so on, thereby making it possible to rapidly and precisely respond to a variety of applications.

3. Prior Art

Conventionally, the semiconductor integrated circuit device 1 as described above is provided with an inter-block protection circuit between both the internal circuits 4A, 4B in addition to the aforementioned input protection circuits 3AA, 3BB, as countermeasures to the electrostatic breakdown. Such an inter-block protection circuit is composed of resistors, rectifying elements, zener diodes or transistors having a similar function, and so on, and is also connected to the power lines 8A, 8B, 9A, 9B on which different supply voltages are fed.

As increasing miniaturization of internal circuits results in lower resistance of internal elements to electrostatic breakdown, the protection against the electrostatic breakdown has been enhanced by enlarging the input protection circuits which are smaller in number than internal elements, and by increasing the number of inter-block protection circuits or enlarging the inter-block protection circuit.

SUMMARY OF THE INVENTION

Presentation of Problems

However, the trend of miniaturization and higher speed of internal circuits is still growing without ceasing, so that repetitions of the conventional approach of increasing the protection circuits no longer provide sufficient protection.

This is because the miniaturization of elements results in a lower resistance of the elements themselves, such as a lower gate breakdown, and moreover reduces the ability of propagating, diffusing and mitigating surge noise because the capacitance associated with or parasitic to elements, wires and so on decreases while the inductance increases.

For this reason, for example, if surge noise is introduced into the internal circuit 4B to cause a larger potential difference between the internal circuit 4A and the internal circuit 4B, the potential suddenly changes locally at and near the input element 12B and the output element 13B to which the potential in the internal circuit 4A is conveyed through the inter-circuit signal wires 12, 13 in the internal circuit 4B (see two-dot chain lines in FIG. 12A). In such an event, conventionally, the inter-block protection circuit 4c would mitigate the potential difference between the internal circuits 4A, 4B to save them from electrostatic breakdown while the input element 12B and so on are still withstanding. However, it would be difficult for the internal circuits, which suffer from a lower mitigating speed in addition to a reduced resistance to breakdown, to save themselves from electrostatic breakdown (see two-dot chain lines and so on in FIG. 12B).

Also, in such a situation, if surge noise is introduced, for example, into the input/output terminal 7B (see FIG. 12C), the existence of the input protection circuit 3B for protecting the internal element 11B may adversely affect the other internal element 12B and so on. The surge noise will be forced to escape to the power lines 8B, 9B through the input protection circuit 3BB, and then is discharged to the outside from the lower power terminal 5B and the ground terminal 6B, and also propagates and diffuses across the internal circuit 4B. In this event (see two-dot chain lines and so on in FIG. 12C), the difference between a time required for the surge noise to reach the active element 12BP in the first connection configuration through the power line 8B and a time required for the surge noise to reach the active element 12BN in the first connection configuration through the power line 9B cannot be ignored. In addition, it is also contemplated that an element which has been intensively and locally affected by the difference in potential with the inter-circuit signal wire 12 has also become more susceptible to failure.

Thus, it is a technical challenge to devise a new protection circuit based on the foregoing knowledge and precognition. Nevertheless, since an increased integration and a larger circuit scale make the design more and more difficult, it is also important, for introducing a new protection circuit, to add further techniques when the protection circuit is implemented to obviate difficulties in applying the automatic designing to a particular semiconductor integrated circuit device which may incorporate the protection circuit, and to avoid damaging the common utilization and generalization of the semiconductor process.

Also, not limited to a circuit configuration in which internal circuits using different supply voltages are both connected to an inter-circuit signal wire for signal transmission, interconnection of internal circuits through certain wires may be established in other configurations. For example, in addition to the provision of internal circuits using different supply voltages, signal wires connecting external connection terminals through input/output circuits to the internal circuits may be branched from the input/output circuits to route branched wires to other internal circuits, in order to input or output the same external signal in some of such internal circuits. Likewise, in such a configuration, an auxiliary protection provided by protection circuits added to input/output circuits in the middle of wires to the internal circuits is no longer sufficient. It is therefore necessary to provide enhanced protection for internal circuits from electrostatic breakdown similarly for semiconductor integrated circuit devices having such signal wires and branched wires.

Means for Solving Problems

The present invention has been made to solve the problems set forth above, and its object is to realize a semiconductor integrated circuit device which is resistant to electrostatic breakdown.

A semiconductor integrated circuit device according to a first aspect of the present invention invented to solve the problem mentioned above is a semiconductor integrated circuit device which has (in a single chip) a plurality of internal circuits having different power lines (for a positive voltage, a negative voltage, a higher voltage, a lower voltage, a ground, and so on), and an inter-circuit signal wire arranged to interconnect these (at least any one pair of) internal circuits (for communicating signals between the internal circuits), wherein near an active element in a first connection configuration (for inputting a signal or for outputting a signal) connected to the inter-circuit signal wire, a plurality of active elements in another connection configuration are arranged to (directly or indirectly) sandwich or surround the active element in the first connection configuration. The active elements in the other connection configuration include elements of an identical or similar structure to the active element in the first connection configuration in repetitions (of the same types or in a mixture of different types), and are connected to power lines of the internal circuits associated therewith and isolated from signal wires other than the inter-circuit signal wire (specifically, any of active elements in a second, a third, a fourth connection configuration, or protection elements like these which are connected to power lines of the internal circuits associated therewith but not connected to signal wires in the internal circuit).

In the semiconductor integrated circuit according to the first aspect of the present invention as described above, in a normal state without surge noise or the like, the newly introduced active elements in the other connection configuration are not connected to signal wires in the internal circuit, so that the active elements in the other connection configuration will not prevent proper operations of the active element in the first connection configuration or other internal elements. On the other hand, if surge noise is introduced into an external connection terminal and propagates through power lines, and reaches the active element in the first connection configuration at different times through the respective power lines, a portion of the surge noise is immediately led from the power line through which the noise had reached earlier to the power line through which the noise has reached later through the active elements in the other connection configuration. This operation is performed at a plurality of locations on both sides of or around the active element in the first connection configuration.

In this way, fluctuations in potential due to the surge noise are dispersed, though only locally, in and near the active element in the first connection configuration to relieve the gradient of the potential dispersion and therefore suppress its peak to a low level. Further, the dispersion and relief are accomplished as uniformly as possible to keep the balance at a plurality of points or multiple points in the surroundings.

Also, as to locations for sharing the potential difference with the potential on the inter-circuit signal wire, the potential fluctuations are dispersed not only to a region in the active element in the first connection configuration connected to the power line through which the surge has propagated earlier but also to a region connected to the power line through which the surge has delayed, promptly added thereto, so that the influence of the inter-circuit signal wire is also dispersed, thus further suppressing the peak of potential difference to a low level in this respect.

Further, since the active elements in the other connection configuration newly introduced as protection elements have the identical or similar structure to the active element in the first connection configuration, these active elements may be implemented in a procedure similar to that of internal elements such as the active element in the first connection configuration by appropriately selecting basic cells previously arranged in line or in matrix around the active element in the first connection configuration to be protected, and connecting selected basic cells to neighboring power lines and so on, so that the newly introduced active elements in the other connection configuration have good compatibility with automatic designing and maintain the common utilization and generalization of the semiconductor processes as before.

It is therefore possible, according to this invention, to realize a semiconductor integrated circuit device which is resistant to electrostatic breakdown and suitable to automatic designing and so on.

A semiconductor integrated circuit device according to a second aspect of the present invention invented to solve the problem mentioned above is a semiconductor integrated circuit device which has (in a single chip) a plurality of internal circuits having difference power lines (for a positive voltage, a negative voltage, a higher voltage, a lower voltage, a ground, and so on), and an inter-circuit signal wire arranged to interconnect these (at least any one pair of) internal circuits (for communicating signals between the internal circuits), wherein near an active element in a first connection configuration (for inputting a signal or for outputting a signal) connected to the inter-circuit signal wire, an active element in a second connection configuration of an identical or similar structure to the active element in the first connection configuration (for protection which is not connected directly to any signal wires driven by active elements other than itself) is arranged and connected to power lines of the internal circuits associated therewith and isolated from the inter-circuit signal wire and other signal wires.

In the semiconductor integrated circuit according to the second aspect of the present invention as described above, the newly introduced active element in the second connection configuration is not connected to signal wires in the internal circuit or to the inter-circuit signal wire, as is the case of the active element in the other connection configuration, so that the active element in the second connection configuration will not prevent proper operations of the active element in the first connection configuration and so on in a normal state. On the other hand, if in an abnormal state in which entering surge propagates through power lines, and reaches the active element in the first connection configuration at different times through the respective power lines, a portion of the surge noise is immediately led from the power line through which the noise had reached earlier to the power line through which the noise has reached later. In this way, fluctuations in potential due to the surge noise are dispersed near the active element in the first connection configuration to suppress its peak to a low level. Further, as to locations for sharing the influence of the inter-circuit signal wire, the influence is dispersed to locations at which the respective power lines are connected, thus further suppressing the peak of potential difference to a low level.

Further, the active element in the second connection configuration newly introduced as a protection element is implemented in a procedure similar to that of internal elements such as the active element in the first connection configuration, as is the case of the aforementioned active elements in the other connection configuration. Moreover, since the active element in the second connection configuration can be introduced irrespective of whether a supply voltage fed to the internal circuit is higher or lower than a supply voltage fed to another internal circuit which exists at an extreme end of the inter-circuit signal wire, the active element in the second connection configuration may be readily implemented in a wide variety of applications.

It is therefore possible, according to this invention, to realize a semiconductor integrated circuit device which is resistant to electrostatic breakdown and suitable to automatic designing and so on.

A semiconductor integrated circuit device according to a third aspect of the present invention invented to solve the problem mentioned above is the semiconductor integrated circuit device according to the second aspect of the present invention which further comprises an active element in a third connection configuration (for protection which is not connected directly to any of signal wires driven by active elements other than itself except for the inter-circuit signal wire), arranged near the active element in the first connection configuration and including an element of an identical or similar structure to the active element in the first connection configuration, wherein the active element in the third connection configuration is connected to power lines of an internal circuit associated therewith and the inter-circuit signal wire, and isolated from other signal lines.

In the semiconductor integrated circuit device according to the third aspect of the present invention as described above, the active element in the third connection configuration, though connected to the inter-circuit signal wire, is introduced only in regions where the active element is unlikely to prevent signal transmission in a normal state, in additional consideration to the magnitude of supply voltage. In regions where the active element in the third connection configuration is likely to prevent signal transmission in a normal state, the active element in the second connection configuration is provided instead. Then, for surge noise as mentioned above, in addition to the aforementioned protection provided by the active element in the second connection configuration, the active element in the third connection configuration more positively disperses the influence of the inter-circuit signal wire, though depending on the direction of the noise, to further suppress the peak of the potential different to a lower level. In addition, the active element in the third connection configuration newly introduced as a protection element is also implemented in a similar procedure to those of the aforementioned active elements in the first and second connection configurations.

It is therefore possible, according to this invention to realize a semiconductor integrated circuit device which is more resistant to electrostatic breakdown and suitable to automatic designing and so on.

A semiconductor integrated circuit device according to a fourth aspect of the present invention invented to solve the problem mentioned above is the semiconductor integrated circuit device according to the third aspect of the present invention, wherein a plurality of the inter-circuit signal wires having different communication directions from each other are arranged in (at least) any one pair of the plurality of internal circuits, the active element in the second connection configuration and the active element in the third connection configuration are arranged near the active element in the first connection configuration on a reception side (i.e., for inputting signals) of the inter-circuit signal wire in one of the pair of internal circuits (i.e., an internal circuit which is fed with a relatively lower supply voltage), and (preferably, a plurality of) the active elements in the third connection configuration are arranged instead of or exclusive of the active element in the second connection configuration (i.e., without providing the active element in the second connection configuration), near the active element in the first connection configuration on a reception the (i.e., for inputting signals) of the inter-circuit signal wire in the other of the pair of internal circuits (i.e., an internal circuit which is fed with a relatively higher supply voltage).

In the semiconductor integrated circuit device according to the fourth aspect of the present invention as described above, the active elements in the second and third connection configurations are provided in combination as appropriate in a region which is restricted in connectivity to an active element to both the inter-circuit signal wire and the power line due to the possibility of the voltage on the inter-circuit signal wire exceeding the voltage on the power line at that location depending on the value of a signal on the inter-circuit signal wire (such a region is typically a reception side of the inter-circuit signal wire in an internal circuit fed with the relatively lower supply voltage, i.e., an input element), and the active element in the third connection configuration is provided at least one and as many as possible in a region which is free of such restriction and is vulnerable to the influence of the inter-circuit signal wire (such a region is typically a reception side of the inter-circuit signal wire in an internal circuit fed with the relatively higher supply voltage, i.e., an input element).

In this way, the protection provided by the active element in the third connection configuration for positively distributing the influence of the inter-circuit signal wire is preferentially applied to a region which is vulnerable to the influence of the inter-circuit signal wire to further suppress the peak of the potential difference to a lower level in that region.

It is therefore possible, according to this invention to realize a semiconductor integrated circuit device which is more resistant to electrostatic breakdown and suitable to automatic designing and so on.

A semiconductor integrated circuit device according to a fifth aspect of the present invention invented to solve the problem mentioned above is a semiconductor integrated circuit device which comprises (in a single chip) a plurality of internal circuits having different power lines (for a positive voltage, a negative voltage, a higher voltage, a lower voltage, a ground, and so on), and an inter-circuit signal wire arranged to interconnect these (at least any one pair of) internal circuits (for communicating signals between the internal circuits), wherein an inter-circuit auxiliary wire (preferably, running in parallel with the inter-circuit signal wire) is connected to a static area (i.e., an area where an electrical condition does not dynamically change in a normally operating state such as a location to which any signal wire is not directly connected) near a location at which the inter-circuit signal wire is connected.

In the semiconductor integrated circuit device according to the fifth aspect of the present invention as described above, while the inter-circuit auxiliary wire is newly introduced, this wire is connected to a location at which an electrical condition does not dynamically change in a normally operating state free of surge noise or the like, so that the inter-circuit auxiliary wire will not prevent proper operations of the active element in the first connection configuration and other internal elements. On the other hand, if surge noise is introduced into any external connection terminal and propagates only to one internal circuit to cause an increased potential difference with the other internal circuit to result in a sudden change in the potential locally at an active element in the first connection configuration in the one internal circuit connected to the other internal circuit through the inter-circuit signal wire, the existence of the inter-circuit auxiliary wire will give rise to a similar potential change at a point near the active element in the first connection configuration. Subsequently, if the potential change propagates to the active element in the first connection configuration, the potential of the entire active element in the first connection configuration will also move to some degree toward the sudden potential at the location at which the inter-circuit signal wire is connected, so that the potential difference between a location connected to the inter-circuit signal wire and a location not connected to the inter-circuit signal wire is canceled by that portion in the active element in the first connection configuration.

Thus, local potential fluctuations produced in the active element in the first connection configuration due to the inter-circuit signal wire is immediately followed by other similar local potential fluctuations produced in its neighborhood by the inter-circuit auxiliary wire, so that the peak of the potential difference produced in the active element in the first connection configuration is suppressed to a low level, whereby the active element in the first connection configuration is more likely to avoid electrostatic breakdown.

Also, the newly introduced inter-circuit auxiliary wire, its connection to a static region, and so on can be implemented by additional changes to an associated wiring pattern or the like, and therefore will not require changes in the structure of the basic cells and other semiconductor layers.

It is therefore possible, according to this invention, to realize a semiconductor integrated circuit device which is resistant to electrostatic breakdown and suitable to automatic designing and so on.

A semiconductor integrated circuit device according to a sixth aspect of the present invention invented to solve the problem mentioned above is the semiconductor integrated circuit device according to the fifth aspect of the present invention, wherein the static area (several static areas connected to the inter-circuit auxiliary wire) includes a partial region of an active element on a transmission side of the active elements in the first connection configuration (i.e., for outputting signals) connected to the inter-circuit signal wire, which partial region is connected to a power line of the internal circuit associated therewith, and an active element (i.e., an active element in a fourth connection configuration for protection which is not directly connected to any of signal wires driven by active elements other than itself) in another connection configuration having an identical or similar structure to the active element in the first connection configuration on a reception side (i.e., for inputting signals), arranged near the active element in the first connection configuration, and isolated from signal wires other than the inter-circuit auxiliary wire (except for a connection to the power line).

In the semiconductor integrated circuit device according to the sixth aspect of the present invention as described above, the active element in the fourth connection configuration (the active element in the other connection configuration), though connected to the internal-circuit auxiliary wire, is only introduced in a region where a different power supply is not short-circuited in a normal state, in additional consideration to the magnitude of supply voltage. With the provision of the active element in the fourth connection configuration, local potential fluctuations produced in an active element in the first connection configuration located near the active element in the fourth connection configuration are not only followed by similar potential fluctuations due to the inter-circuit auxiliary wire but also forced to positively escape through the active element in the fourth connection configuration and the inter-circuit auxiliary wire.

In this way, since the influence of the inter-circuit signal wire produced in the reception side, which is relatively more vulnerable, is dispersed to the transmission side, which is relatively more resistant, the active element in the first connection configuration is still more likely to avoid electrostatic breakdown.

In addition, the active element in the fourth connection configuration newly introduced as a protection element is also implemented in a similar procedure to those of the aforementioned active elements in the first to third connection configurations.

It is therefore possible, according to this invention, to realize a semiconductor integrated circuit device which is more resistant to electrostatic breakdown and suitable to automatic designing and so on.

A semiconductor integrated circuit device according to a seventh aspect of the present invention invented to solve the problem mentioned above is the semiconductor integrated circuit device according to the sixth aspect of the present invention, wherein the inter-circuit auxiliary wire is connected to a neighboring region overlapping with or close to the partial region on the power line connected thereto, instead of the partial region.

In the semiconductor integrated circuit device according to the seventh aspect of the present invention as described above, the inter-circuit auxiliary wire is connected to a different location which is equivalent in function because of its closeness to the partial region. This results in an increased width of selection during the design of wiring, and relieved restrictions, so that the designing becomes easier. It is therefore possible, according to this invention, to realize a semiconductor integrated circuit device which is more resistant to electrostatic breakdown and more suitable to automatic designing and so on.

A semiconductor integrated circuit device according to an eighth aspect of the present invention invented to solve the problem mentioned above is the semiconductor integrated circuit device according to the sixth or seventh aspects of the present invention, wherein a plurality of the inter-circuit signal wires having different communication directions from each other are arranged in (at least) any one pair of the plurality of internal circuit, an active element in a further connection configuration (i.e., the active element in the second connection configuration which is not directly connected to any of signal wires driven by active elements other than itself) having an identical or similar structure to the active element in the other connection configuration is arranged in addition to the active element in the other connection configuration (i.e., the active element in the fourth connection configuration) near an active element in the first connection configuration on a reception side (i.e., for inputting signals) of the inter-circuit signal wire in one of the pair of internal circuits (i.e., an internal circuit fed with a relatively lower supply voltage), wherein the active element in the further connection configuration connected to a power line of the internal circuit and isolated from the inter-circuit signal wire, other signal wires and the inter-circuit auxiliary wire, and (preferably, a plurality of) the active elements in the other connection configuration (i.e., the active element in the fourth connection configuration) are arranged instead of or exclusive of the active element in the further connection configuration (i.e., the active element in the second connection configuration) (i.e., without providing the active element in the second connection configuration), near the active element in the first connection configuration on a reception side (i.e., for inputting signals) of the inter-circuit signal wire in the other of the pair of internal circuits (i.e., an internal circuit fed with a relatively higher supply voltage).

In the semiconductor integrated circuit device according to the eighth aspect of the present invention, the active elements in the fourth connection configuration (the active element in the other connection configuration) and the active element in the second connection configuration (the active element in the further connection configuration) are provided in combination as appropriate in a region which is restricted in connectivity to an active element to both the inter-circuit signal wire and the power line and is vulnerable to the influence of the inter-circuit signal wire (such a region is typically a reception side of the inter-circuit signal wire in an internal circuit fed with the relatively lower supply voltage, i.e., an input element), and the active element in the fourth connection configuration is provided as many as possible in a region which is free of such restriction and is vulnerable to the influence of the inter-circuit signal wire (such a region is typically reception side of the inter-circuit signal wire in an internal circuit fed with the relatively higher supply voltage, i.e., an input element).

In this way, the protection provided try the active element in the fourth connection configuration for positively distributing the influence of the inter-circuit signal wire is preferentially applied to a region which is vulnerable to the influence of the inter-circuit signal wire to further suppress the peak of the potential difference to a lower level in that region. It is therefore possible, according to this invention to realize a semiconductor integrated circuit device which is still more resistant to electrostatic breakdown and suitable to automatic designing and so on.

A semiconductor integrated circuit device according to a ninth aspect of the present invention invented to solve the problem mentioned above is the semiconductor integrated circuit device according to the second to eighth aspects of the present invention, wherein a plurality of the active elements in the second, third, other, and further connection configurations or those corresponding thereto (i.e., protection elements arranged near the active element in the first connection configuration, and connected to a power line of the internal circuit associated therewith but not connected to signal wires in the internal circuit) are arranged to (directly or indirectly) sandwich or surround the active element in the first connection configuration (in repetitions of the same type or in mixture of different types).

In the semiconductor integrated circuit device according to the ninth aspect of the present invention as described above, surge noise is bypassed or dispersed at a plurality of locations such as on both sides or around the active element in the first connection configuration, so that the surge noise is substantially uniformly mitigated to keep the balance at a plurality of points or multiple points.

This enhances the protection for the active element in the first connection configuration more than situations where a single protection element is provided or the protection element is provided only on one side of the active element in the first connection configuration.

It is therefore possible, according to this invention to realize a semiconductor integrated circuit device which is still more resistant to electrostatic breakdown and suitable to automatic designing and so on.

A semiconductor integrated circuit device according to a tenth aspect of the present invention invented to solve the problem mentioned above is a semiconductor integrated circuit device, wherein, for a signal wire which originates from an external connection terminal, passes through an input/output circuit in one of a plurality of sets comprised of any of the internal circuits and any of the input/output circuits, connected to different power lines, and reaches the internal circuit included in the same set as the input/output circuit, a first protection circuit is provided in the input/output circuit of the one set for the signal wire to protect the internal circuit of the one set from electrostatic breakdown, and additionally, for a branched wire which is branched from the signal wire and reaches an internal circuit in any of the plurality of sets, a second protection circuit is provided in the input/output circuit in the other set after the branched wire is passed through the input/output circuit of the other set before it reaches the internal circuit of the same set, and a third protection circuit is also provided in the internal circuit in the other set for the branched wire, so that the internal circuit in the other set can be protected from electrostatic breakdown at multiple stages.

A semiconductor integrated circuit device according to an eleventh aspect of the present invention invented to solve the problem mentioned above is the semiconductor integrated circuit device according to the tenth aspect of the present invention, wherein in a region where it is difficult to directly connect a portion or all of protection elements included in the first, second and third protection circuits to the signal wire or the branched wire due to a difference in supply voltage or the like, an active element is connected to a power line of an associated input/output circuit or an associated internal circuit, and isolated from any signal wire such that the active element acts as a protection element.

A semiconductor integrated circuit device according to a twelfth aspect of the present invention invented to solve the problem mentioned above is the semiconductor integrated circuit device according to the tenth or eleventh aspect of the present invention, wherein the third protection circuit includes a plurality of protection elements which are arranged to sandwich or surround an element to be protected, thereby protecting the element from the surroundings.

DETAILED DESCRIPTION OF THE PREFERRED EMBODIMENTS

Preferred modes for implementing semiconductor integrated circuit devices according to the present invention will hereinafter be described in specific manner with reference to the following first to seventh embodiments.

Figure 1A:
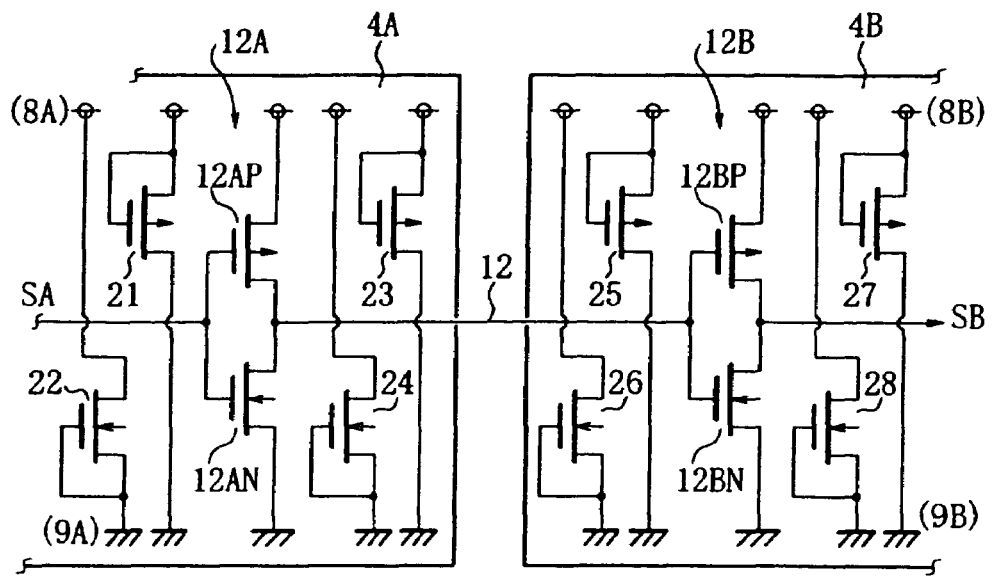
FIG. 1A is a circuit diagram illustrating in detail a main portion in a semiconductor integrated circuit device according to a first embodiment of the present invention.
Figure 1B:
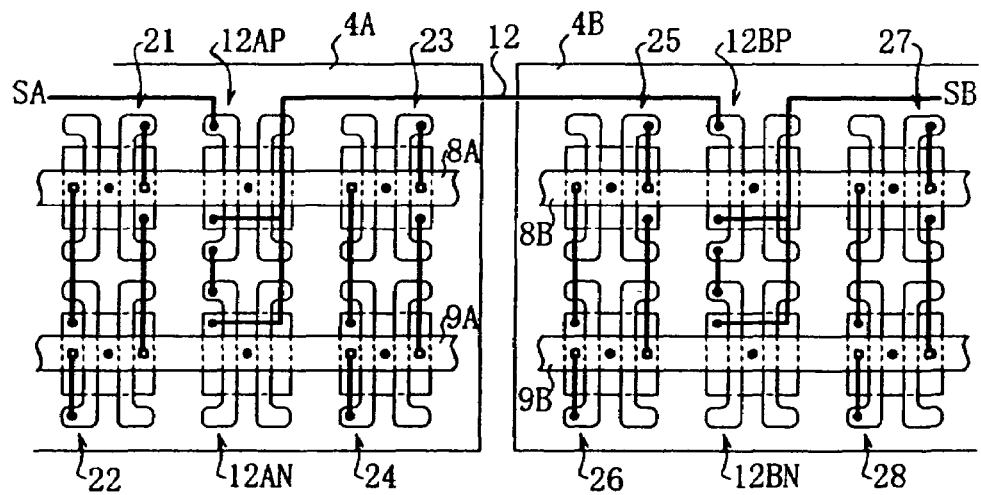
FIG. 1B is a layout diagram of the main portion illustrated in FIG. 1A in the semiconductor integrated circuit device according to the first embodiment of the present invention.
Figure 1C:
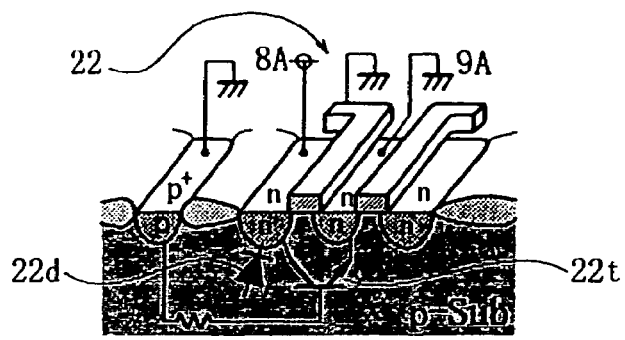
FIG. 1C is a vertically sectioned perspective view illustrating a semiconductor region and a gate, which constitute a basic unit, in the semiconductor integrated circuit device according to the first embodiment of the present invention.
Figure 2A:
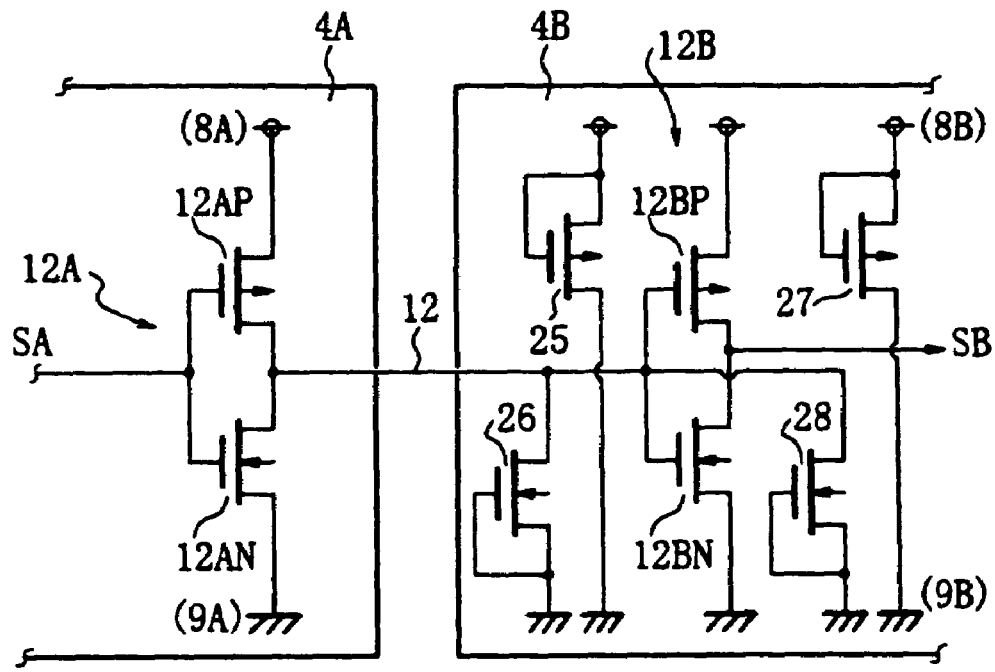
FIG. 2A is a circuit diagram illustrating in detail a main portion in a semiconductor integrated circuit device according to a second embodiment of the present invention.
Figure 2B:
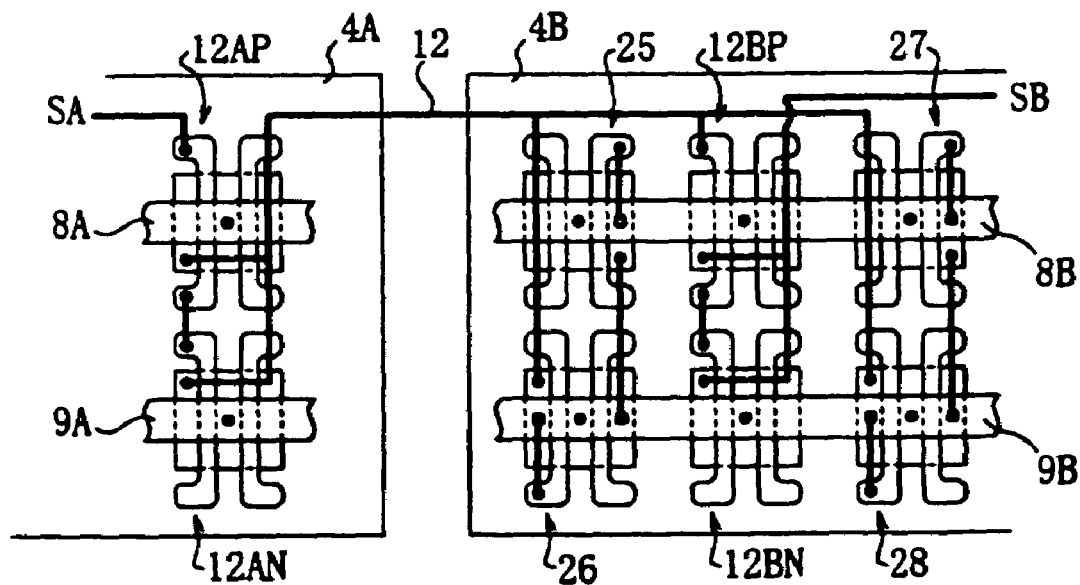
FIG. 2B is a layout diagram of the main portion illustrated in FIG. 2A in the semiconductor integrated circuit device according to the second embodiment of the present invention.
Figure 3:
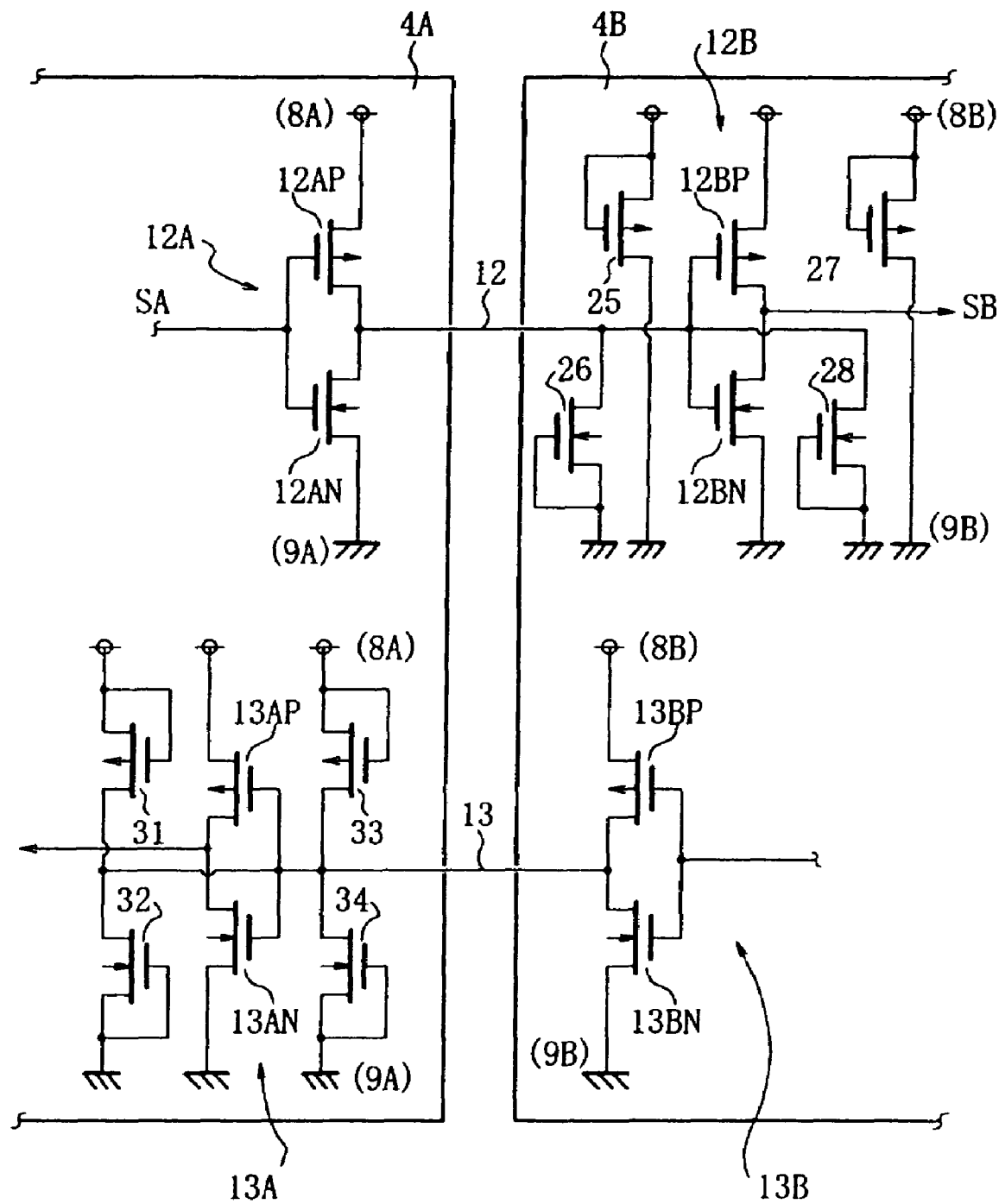
FIG. 3 is a circuit diagram illustrating in detail a main portion in a semiconductor integrated circuit device according to a third embodiment of the present invention.

A first embodiment illustrated in FIGS. 1A to 1C embodies the aforementioned first, second and ninth solutions; a second embodiment illustrated in FIGS. 2A and 2B embodies the aforementioned first, third and ninth solutions; and a third embodiment illustrated in FIG. 3 embodies the aforementioned first, fourth and ninth solutions.

Figure 4A:
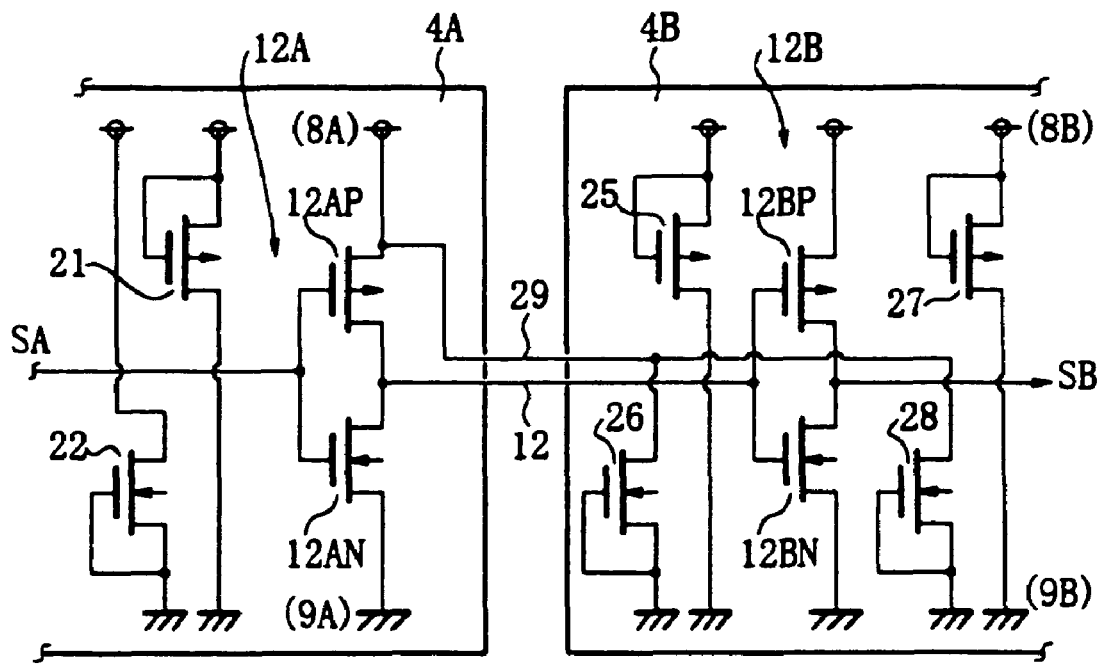
FIG. 4A is a circuit diagram illustrating in detail a main portion in a semiconductor integrated circuit device according to a fourth embodiment of the present invention.
Figure 4B:
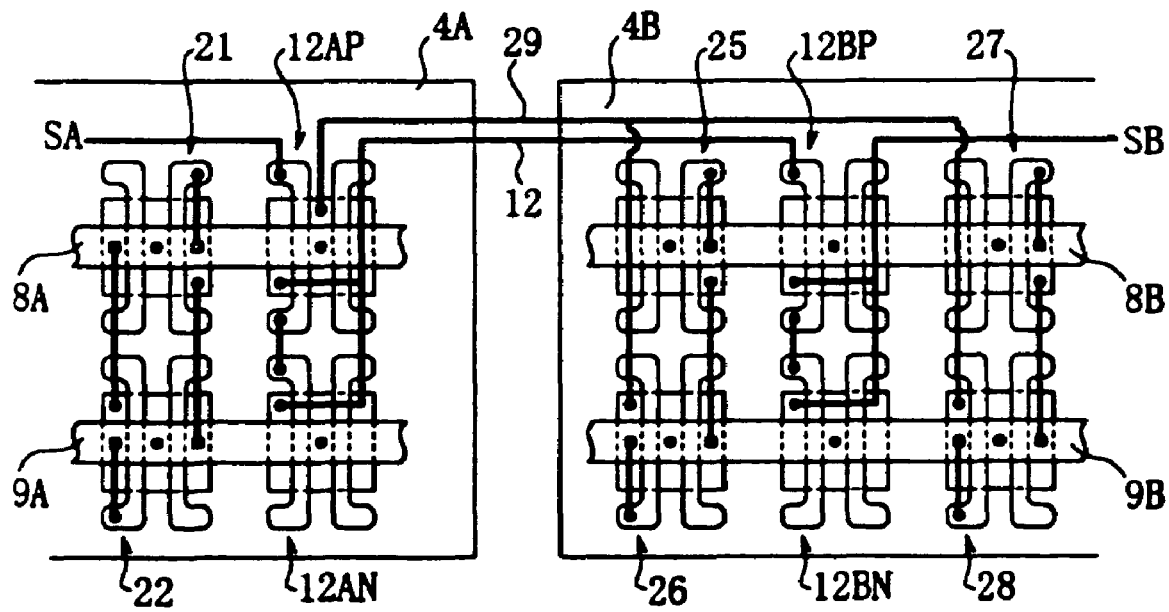
FIG. 4B is a layout diagram of the main portion illustrated in FIG. 4A in the semiconductor integrated circuit device according to the fourth embodiment of the present invention.
Figure 5A:
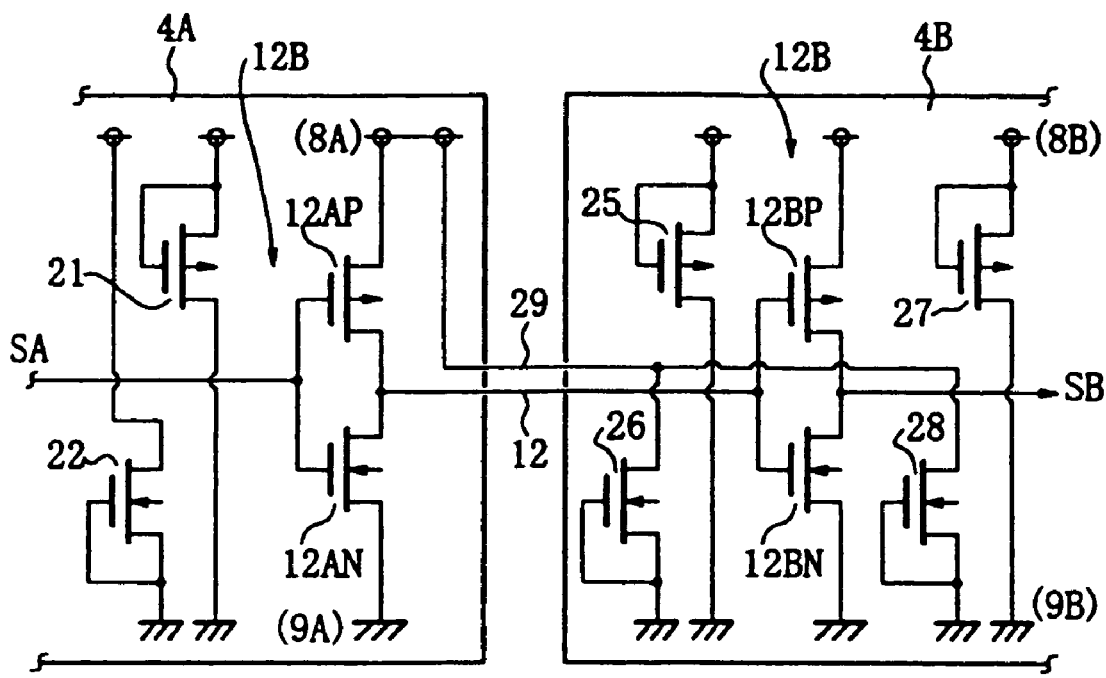
FIG. 5A is a circuit diagram illustrating in detail a main portion in a semiconductor integrated circuit device according to a fifth embodiment of the present invention.
Figure 5B:
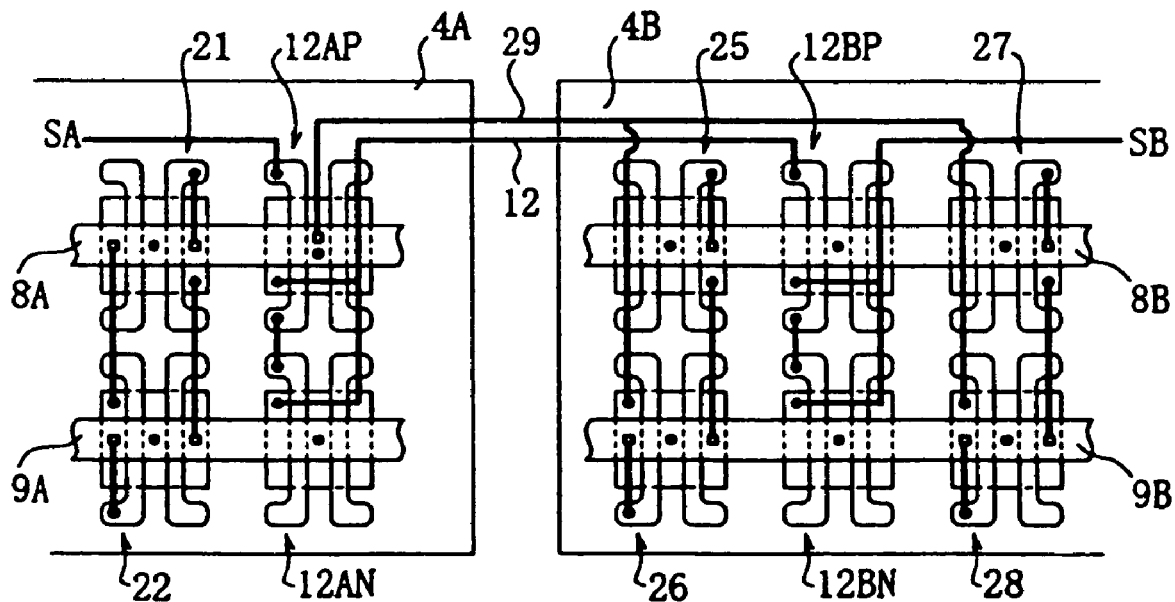
FIG. 5B is a layout diagram of the main portion illustrated in FIG. 5A in the semiconductor integrated circuit device according to the fifth embodiment of the present invention.
Figure 6:
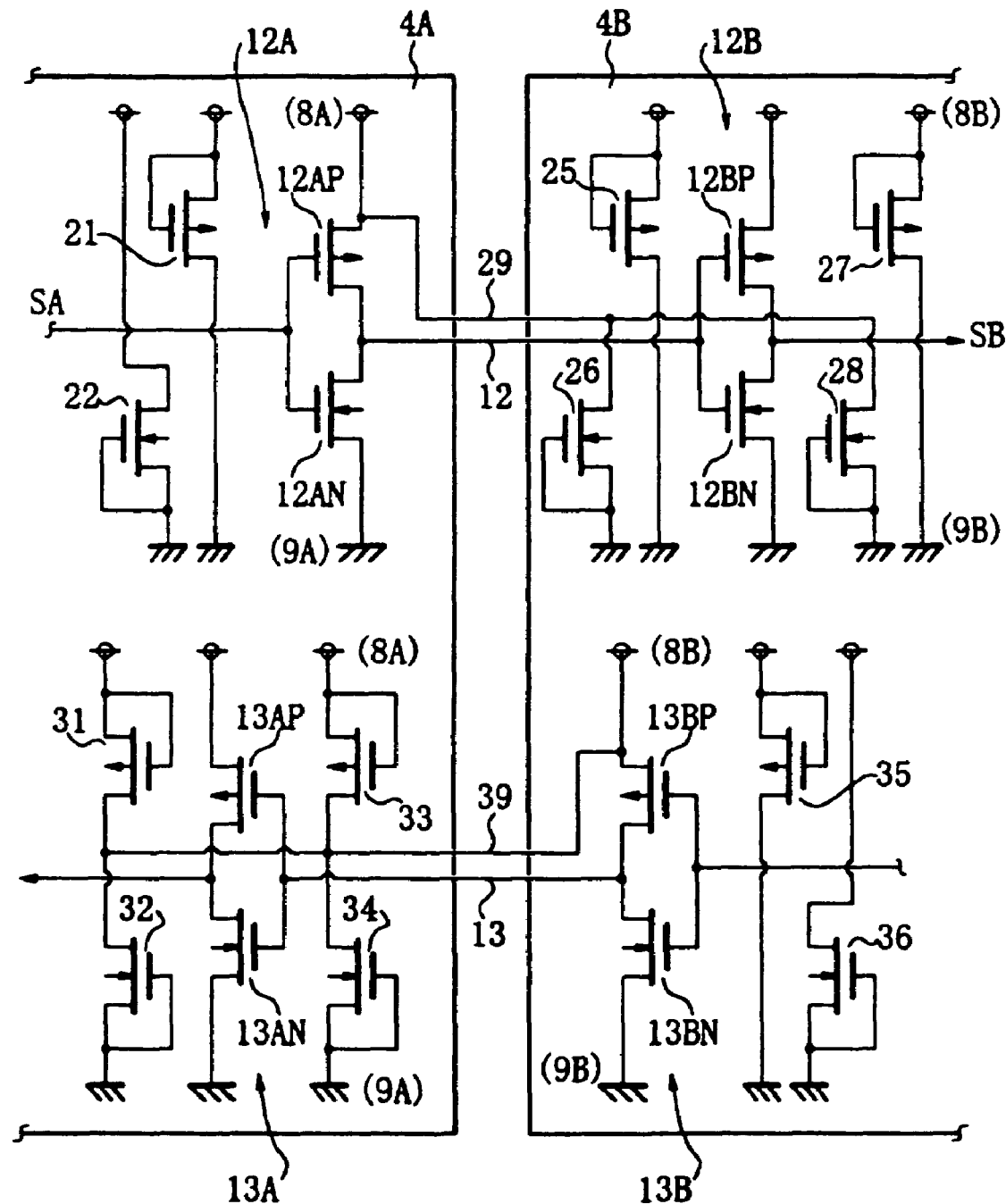
FIG. 6 is a circuit diagram illustrating in detail a main portion in a semiconductor integrated circuit device according to a sixth embodiment of the present invention.

In addition, a fourth embodiment illustrated in FIGS. 4A and 4B embodies the aforementioned first, fifth, sixth and ninth solutions; a fifth embodiment illustrated in FIGS. 5A and 5B embodies the aforementioned first, fifth, seventh and ninth solutions; and a sixth embodiment illustrated in FIG. 6 embodies the aforementioned first, eighth and ninth solutions.

Figure 7:
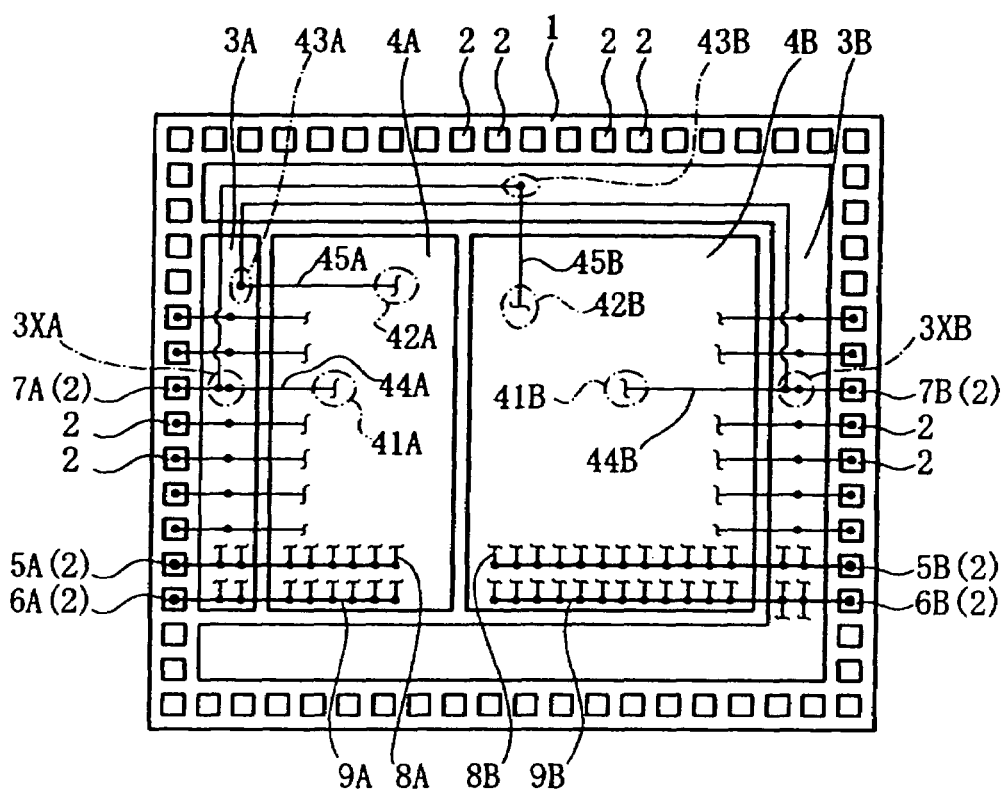
FIG. 7 is a schematic diagram generally illustrating the layout on a main surface of a semiconductor integrated circuit device according to a seventh embodiment of the present invention.
Figures 8A, 8B:
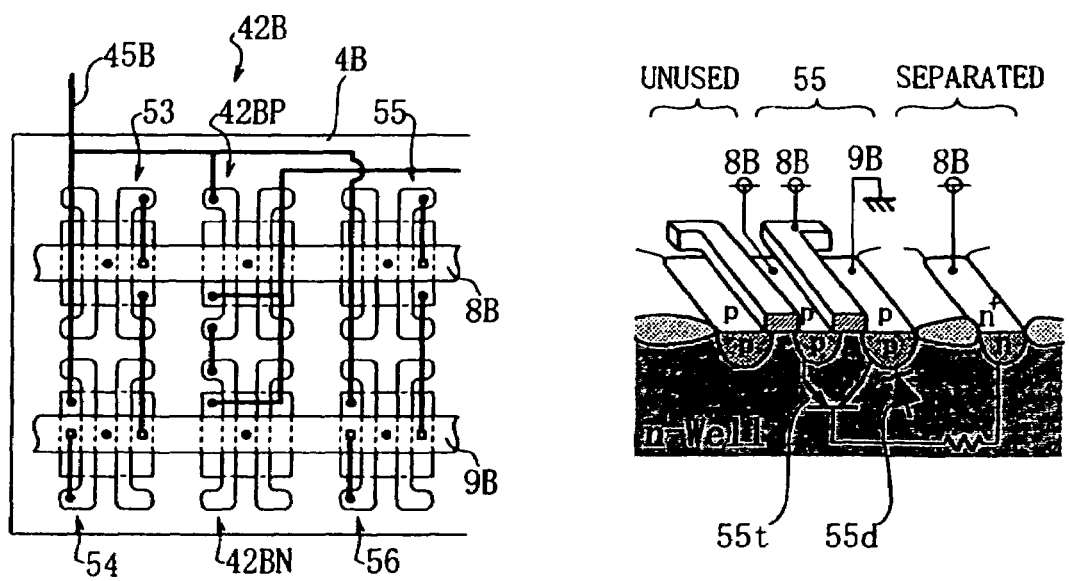
FIG. 8A is a layout diagram illustrating a protection circuit and so on in an internal circuit in the semiconductor integrated circuit device according to the seventh embodiment of the present invention.
FIG. 8B is a vertically sectioned perspective view illustrating a semiconductor region and a gate, which constitute a basic unit, in the semiconductor integrated circuit device according to the seventh embodiment of the present invention.
Figure 9:
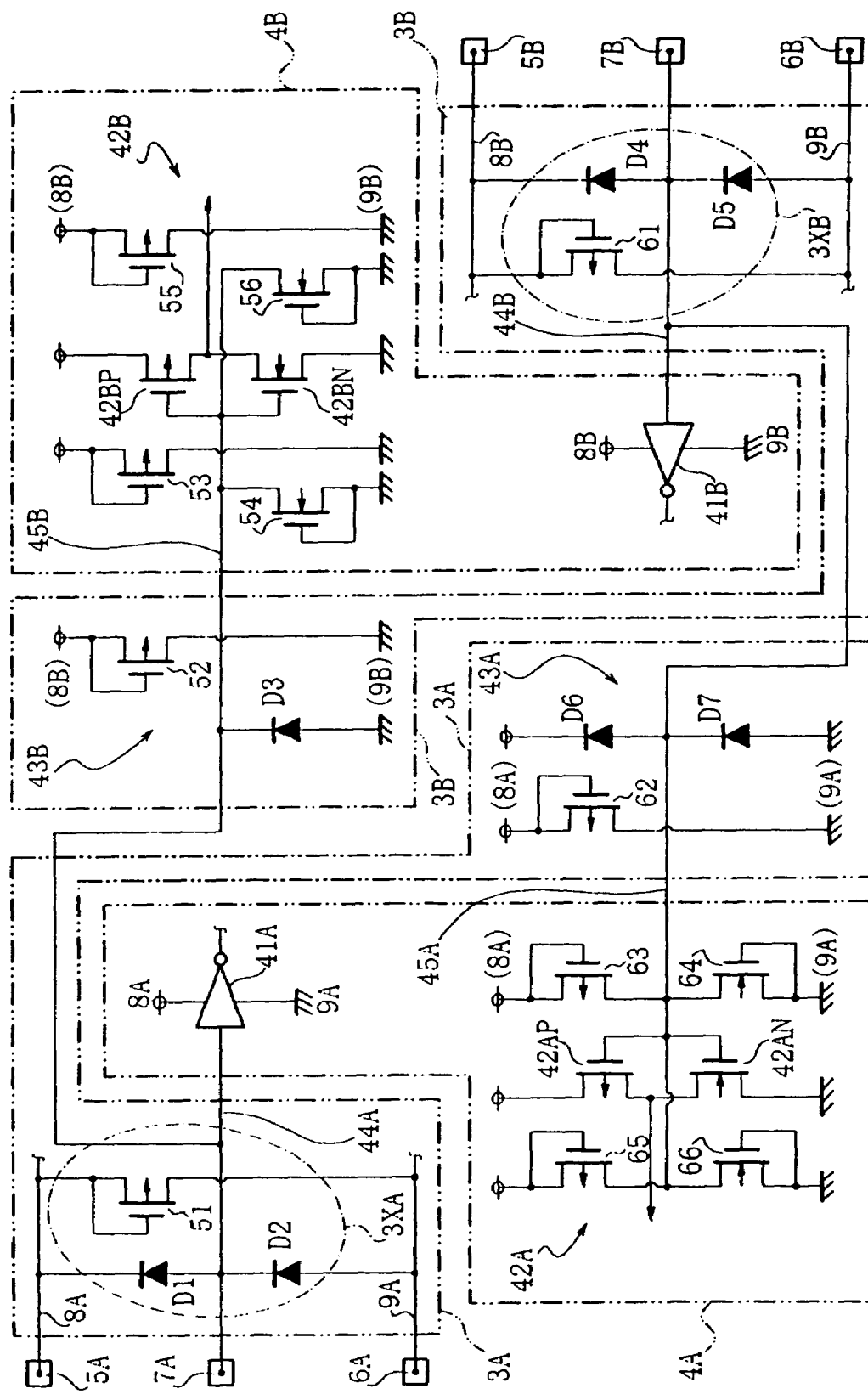
FIG. 9 is a circuit diagram of a protection circuit and portions directly associated therewith in the semiconductor integrated circuit device according to the seventh embodiment of the present invention.
Figure 10A:
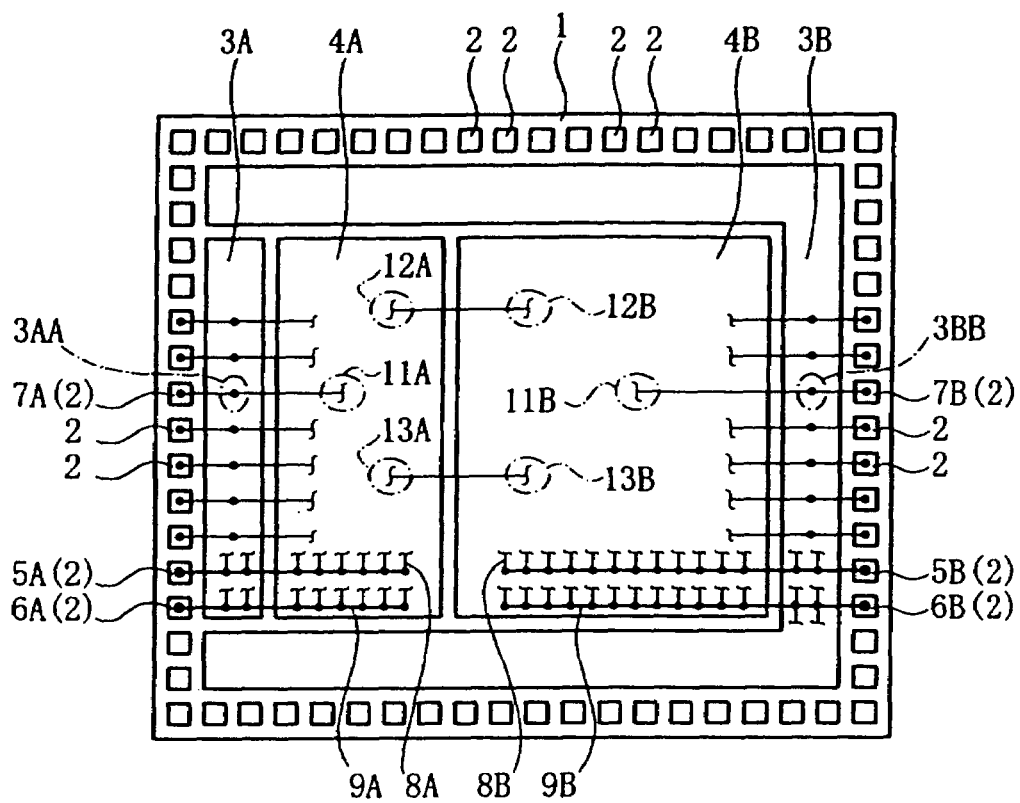
FIG. 10A is a schematic layout diagram of an entire chip for illustrating the technical background, showing a general layout of a semiconductor integrated circuit device having a plurality of internal circuits using different power lines.
Figure 10B:
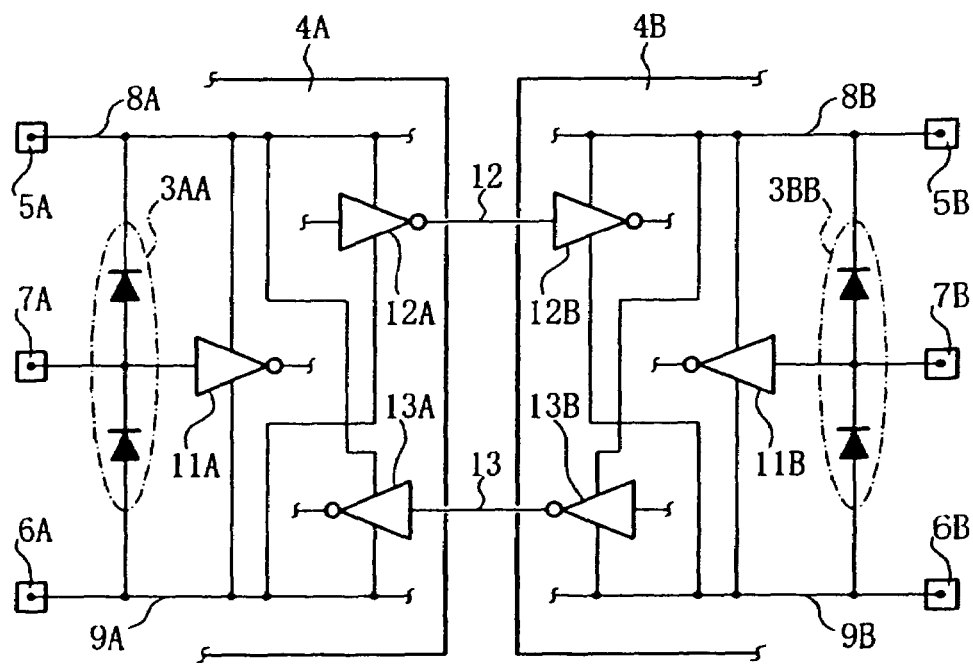
FIG. 10B is a circuit diagram of a mail, portion of the chip shown in FIG. 10A for illustrating the technical background.
Figure 11A:
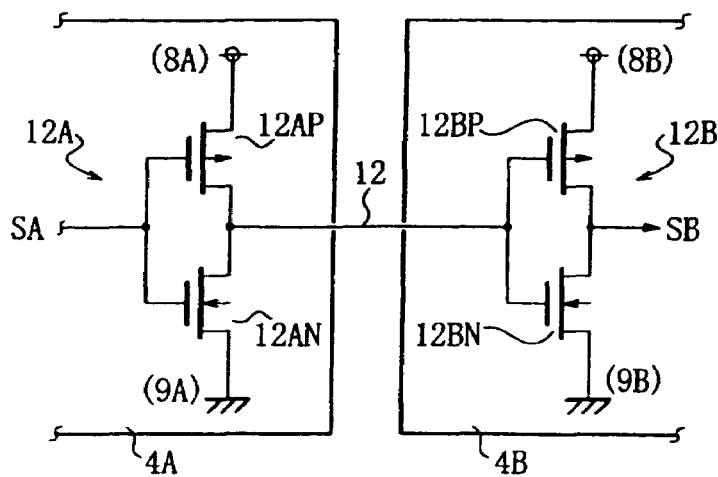
FIG. 11A is a detailed circuit diagram illustrating portions of internal circuits which communicate signals therebetween, at an element level, for illustrating the technical background.
Figure 11B:
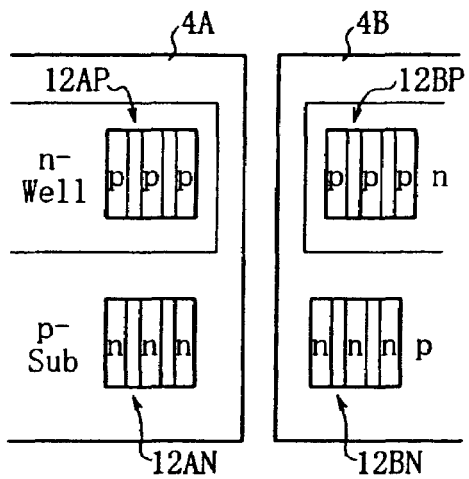
FIG. 11B is a layout diagram of a semiconductor region for illustrating the technical background.
Figure 11C:
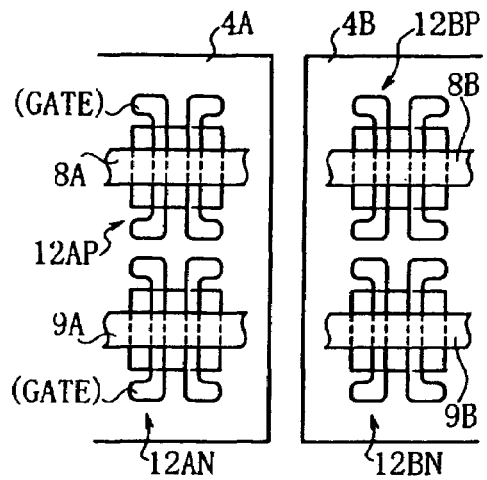
FIG. 11C is a layout diagram of the semiconductor regions in which gates and power lines have been additionally patterned for illustrating the technical background.
Figure 11D:
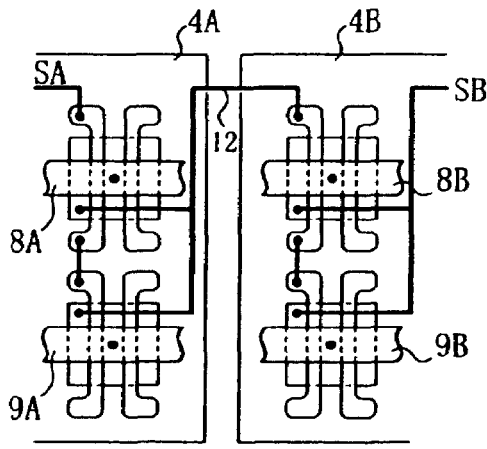
FIG. 11D is a layout diagram of the semiconductor regions in which signal wires have been further patterned for illustrating the technical background.
Figure 11E:
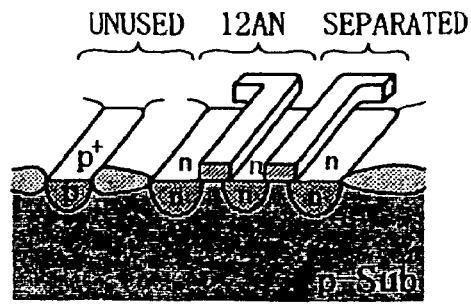
FIG. 11E is a vertically sectioned perspective view illustrating a semiconductor region and a gate which constitute a basic unit for illustrating the technical background.

Further, a seventh embodiment illustrated in FIGS. 7 to 9 embodies the aforementioned tenth to twelfth solutions.

It should be noted that the discussions previously given in Description of Technical Background are similarly applied to the respective embodiments, so that repetitive description will be omitted and the following discussion will be focused on differences between the prior art and the respective embodiments.

First Embodiment

A first embodiment of a semiconductor integrated circuit device according to the present invention will be described in terms of its specific configuration with reference to FIGS. 1A to 1C. FIG. 1A is a detailed circuit diagram of a main portion; FIG. 1B is a layout diagram of the main portion; and FIG. 1C is a vertically sectioned perspective view illustrating a semiconductor region and a gate which constitute a basic unit.

This semiconductor integrated circuit device comprises a plurality of internal circuits having different power lines, i.e., an internal circuit 4A having power lines 8A, 9A and an internal circuit 4B having power lines 8B, 9B; an inter-circuit signal wire 12 extending between these internal circuits 4A, 4B; an output element 12A included in the internal circuit 4A and connected to a signal transmission side of the inter-circuit signal wire 12; and an input element 12B included in the internal circuit 4B and connected to a signal reception side of the inter-circuit signal wire 12. While the semiconductor integrated circuit device of the first embodiment is identical to the aforementioned prior art semiconductor integrated circuit device 1 in that p-type MOS (hereinafter abbreviated as the "pMOS") transistors 12AP, 12BP and n-type MOS (hereinafter abbreviated as the "nMOS") transistors 12AN, 12BN are active elements in a first connection configuration, the first embodiment differs from the semiconductor integrated circuit device 1 in that the following components are added near the active elements in the first connection configuration.

Specifically, with respect to a basic cell to which the active element 12AP in the first connection configuration is allocated, a basic cell on the left side is allocated a pMOS transistor 21, and a basic cell on the right side is likewise allocated a pMOS transistor 23. Also, with respect to a basic cell to which the active element 12AN in the first connection configuration is allocated, a basic cell on the left side is allocated an NMOS transistor 22, and a basic cell on the right side is likewise allocated an NMOS transistor 24. Similarly, with respect to a basic cell to which the active element 12BP in the first connection configuration is allocated, a basic cell on the left side is allocated a pMOS transistor 25, and a basic cell on the right side is allocated a pMOS transistor 27. With respect to a basic cell to which the active element 12BN in the first connection configuration is allocated, a basic cell on the left side is allocated an nMOS transistor 26, and a basic cell on the right side is likewise allocated an nMOS transistor 28.

Within the foregoing transistors, the pMOS transistors 21, 23 have their sources and gates connected to the power line 8A, and their drains connected to the power line 9A. The nMOS transistors 22, 24 have their sources and gates connected to the power line 9A, and their drains connected to the power line 8A. Similarly, the pMOS transistors 25, 27 have their sources and gates connected to the power line 8B, and their drains connected to the power line 9B, while the nMOS transistors 26, 28 have their sources and gates connected to the power line 9B, and their drains connected to the power line 8B.

A plurality of such MOS transistors 21–28 are all positioned near associated active elements in the first connection configuration to sandwich the active elements on both left and right sides. A pair of MOS transistors sandwiching an active element are of the same conductive type as the active element, i.e., the p-type if the sandwiched active element is p-type, and the n-type if the active element is n-type. The MOS transistors 21–28 are connected only to the power lines 8A, 9A, 8B, 9B of the associated internal circuits 4A, 4B, but are not connected to the inter-circuit signal wire 12 or other signal wires, and function as active elements in a second connection configuration for protecting the associated active elements in the first configuration from the surroundings. Moreover, the allocation and/or a wiring pattern for these MOS transistors 21–28 can be readily automatically processed by, for example, previously adding local library cells to a design tool for automatic wiring, and specifying an appropriate library cell to each active element in the first connection configuration, or by allowing appropriate library cells be automatically specified in response to the generation of inter-circuit signal wires.

The following discussion will be centered on the operation of the semiconductor integrated circuit device according to the first embodiment when in use.

While the MOS transistors 21–28 are connected to the power line pairs 8A+9A, 8B+9B, each of the MOS transistors 21–28 has its source and gate connected, so that it does not conduct and therefore never affects not only supply voltages but also the voltage on the inter-circuit signal wire 12, the operation of the output element 12A and the operation of the input element 12B in a normally operating state.

It should be noted however that due to the nature of active 25 element, the respective MOS transistors 21–28 have parasitic capacitance, though very little, in active regions such as pn junctions, so that instantaneous noise or the like can be passed in both directions to some degree. Further, in the respective active elements provided in the basic cells of this embodiment (for example, see the nMOS transistor 22 in FIG. 1C), recognition is given to the existence of a parasitic diode (22d) which becomes conductive to begin operating in response to the drain attempting to swing abnormally to the negative side, and a parasitic transistor (22t) which becomes conductive to begin operating in response to the drain jumping abnormally deep into the positive side.

Then, assuming that surge noise has been introduced into the internal circuit 4B and first reached the input element 12B through the power line 8B but has not reached through the power line 9B, the pMOS transistor 12BP has its source connected to the power line 8B and its gate regulated by the inter-circuit signal wire 12 to a potential in the internal circuit 4A free of noise, so that a potential difference develops intensively across the source and the gate of the pMOS transistor 12BP, thus causing the gate oxide film of the pMOS transistor 12BP to face a crisis of electrostatic breakdown.

However, the surge noise on the power line 8B reaches the MOS transistors 25–28 immediately near the pMOS transistor 12BP substantially simultaneously with the arrival to the source of the pMOS transistor 12BP. Then, the surge noise is forced to escape to the power line 9B through parasitic capacitance of these MOS transistors, and also through the parasitic diode 22d and the parasitic transistor 22t, depending on a particular noise condition, more positively to the power line 9B.

In this way, a surge current flowing into the source of the pMOS transistor 12BP is dispersed and slightly reduced.

Since the surge noise flowing into the power line 9B immediately transmits to the source of the nMOS transistor 12BN, a potential difference develops across the source and the gate of the NMOS transistor 12BN, whereby a charge existing near the input element 12B on the inter-circuit signal wire 12 is bisected to the gates of the transistors 12BP, 12BN.

In the manner described above, the gate oxide film is instantaneously relieved more from the likelihood of electrostatic breakdown.

Furthermore, since the surge current flowing into the MOS transistors 25–28 causes simultaneous rising and falling of the potentials at back gates and so on within regions in which the MOS transistors 25–28 are located (associated regions in the substrate or wells), the potentials at the drains of the transistors 12BP, 12BN are also changed in the same direction as those at the sources to some degree to the accompaniment of the varying potentials. The changes in the potentials also cause charges on the inter-circuit signal wire 12, which have attempted to deviate toward the sources in the transistors 12BP, 12BN, to be dispersed to the drains.

Consequently, the surge noise promptly reaching the input element 12B through the power line 8B is rapidly dispersed by the surrounding MOS transistors 25–28 to the neighborhood. Then, in the meantime, the surge noise also reaches through the power line 9B, and the regulation performed through the inter-circuit signal wire 12 is supplemented by the internal circuit 4A. However, since such delayed noise has its peek limited on the way to the input element 12B, the possibility of destroying the gate oxide film by electrostatic breakdown is relatively low. Thus, the input element 12B is more reliably protected from electrostatic breakdown by distributing and mitigating the surge noise which has reached earlier.

Although repetition of detailed description is omitted, the input element 12B and the output element 12A are more reliably protected from electrostatic breakdown in a similar manner against surge noise which propagates first on the other power lines 9B, 8A, 9A.

Second Embodiment

Next, a second embodiment of the semiconductor integrated circuit device according to the present invention will be described in terms of its specific configuration with reference to FIGS. 2A and 2B. FIG. 2A is a detailed circuit diagram of a main portion, and FIG. 2B illustrates the layout in the main portion.

The semiconductor integrated circuit device of the second embodiment differs from the first embodiment in that the MOS transistors 21–24 are removed from the surroundings of the output element 12A in the internal circuit 4A, and the nMOS transistors 26, 28 have their drains connected to the inter-circuit signal wire 12 instead of the power line 8B in the internal circuit 4B.

With the modified configuration set forth above, the pMOS transistors 25, 27 remain as active elements in the second connection configuration for protecting the active element 12BP in the first connection configuration from both left and right sides, whereas the nMOS transistors 26, 28 are positioned near the active element 12BN in the first connection configuration so as to sandwich the active element 12BN on both left and right sides. While the nMOS transistors 26, 28 are of the same n-type as the associated active element 12BN in the first connection configuration and are connected to the power line 9B in the internal circuit 4B and the inter-circuit signal wire 12, the nMOS transistors 26, 28 are not connected to other signal wires so that they function as active elements in a third connection configuration for protecting the active element 12BN in the first connection configuration from the surroundings.

In this case, the nMOS transistors 26, 28, though causing a slight delay in rising and falling of a signal on the inter-circuit signal wire 12, will not become conductive as long as a voltage on the inter-circuit signal wire 12 and a voltage on the power line 9B are not inverted or excessively separated, so that they will not damage proper operations of the internal circuits 4A, 4B.

Then, as surge noise reaches the input element 12B through the power line 8B earlier than through the power line 9B, the surge noise is dispersed to the nearby power line 9B and so on and mitigated by the pMOS transistors 25, 27 in a manner similar to the foregoing.

In this event, in addition to this operation, the active elements 26, 28 in the third connection configuration become conductive by their diode operation or punch-through operation to force the surge noise to escape from the power line 9B to the inter-circuit signal wire 12 together with an actual current, if the potential difference between the power line 9B and the inter-circuit signal wire 12 is inverted or excessively separated.

Consequently, the potential difference between the inter-circuit signal wire 12 and the power lines 9B, 8B is more positively prevented from increasing than in the first embodiment to suppress the peak of the potential difference between gate and source & drain in the active elements 12BP, 12BN in the first connection configuration, thereby sufficiently reducing the likelihood of electrostatic breakdown to the gate oxide film of the input element 12B.

It should be noted that although the active elements 12AP, 12AN in the first connection configuration in the internal circuit 4A are also affected by the surge noise flowing into the inter-circuit signal wire 12, the output element 12A is less susceptible to electrostatic breakdown by virtue of the surge noise suppressed by parasitic inductance of the inter-circuit signal wire 12 in addition to the inter-circuit signal wire 12 being connected to the drains, not to the gates, of the constituent active elements of the output element 12A in the first connection configuration. From this point of view, the MOS transistors 21–24 are removed to make better trade-off between the efficiency of protection and an increase in the number of elements.

Third Embodiment

Next, a third embodiment of the semiconductor integrated circuit device according to the present invention will be described in terms of its specific configuration with reference to FIG. 3 which illustrates a detailed circuit diagram of a main portion of the semiconductor integrated circuit device.

The semiconductor integrated circuit device of the third embodiment differs from the second embodiment in that the former is explicitly provided additionally with an inter-circuit signal wire 13 on which signals are sent and received in the reverse directions to the inter-circuit signal wire 12, and similar protection measures are taken likewise for this inter-circuit signal wire 13.

Specifically, for the inter-circuit signal wire 12, no protective elements are added to the output element 12A on the transmission side of the inter-circuit signal wire 12, while active elements 25, 27 in the second connection configuration and active element 26, 28 in the third connection configuration are mixedly provided around the input element 12B on the reception side of the inter-circuit signal wire 12 as protective elements. For the inter-circuit signal wire 13, on the other hand, no protective elements are added to the output element 13B on the transmission side of the inter-circuit signal wire 13, while four MOS transistors 31–34 are provided around the input element 13A on the reception side of the inter-circuit signal wire 13 as protective elements.

Within these protective elements, the transistors 31, 33 are pMOS transistors having the same structure as the active element 13AP in the first connection configuration, and are positioned on the left and right sides of the active element 13AP in the first connection configuration. The transistors 32, 34 in turn are nMOS transistors having the same structure as the active element 13AN in the first connection configuration, and are positioned on the left and right sides of the active element 13AN in the first connection configuration. Also, all of these transistors 31–34 have their sources and gates connected to the power line 8A in the internal circuit 4A, and their drains connected to the inter-circuit signal wire 13, but are not connected to other signal wires, so that they function as active elements in the third connection configuration for protecting the active elements 13AP, 13AN in the first configuration from the surroundings. In this way, the semiconductor integrated circuit device of the third embodiment does not comprise any active element in the second connection configuration but merely comprises a plurality of active elements in the third connection configuration near the active element 13A in the first connection configuration on the reception side of the inter-circuit signal wire 13.

With this configuration, the internal circuits 4A, 4B are protected from electrostatic breakdown related to the inter-circuit wire 12 in a manner similar to the aforementioned embodiments. Also, with respect to the inter-circuit wire 13, the nMOS transistors 32, 34 will not become conductive as long as the voltage on the inter-circuit signal wire 13 and the voltage on the power line 9A are not inverted or excessively separated, as is the case of the aforementioned nMOS transistors 26, 28. Similarly, the pMOS transistors 31, 33, though causing a slight delay in rising and falling of a signal on the inter-circuit signal wire 13 due to the voltage on the power line BA being normally higher than the highest voltage on the inter-circuit signal wire 13 driven by the power line 8B, will not become conductive as long as the voltage on the inter-circuit signal wire 13 and the voltage on the power line 9A are not inverted or excessively separated. As a result, proper operations of the internal circuits 4A, 4B are also maintained in this respect.

Thus, the input element 13A is positively protected against the inter-circuit signal wire 13 by all of the four additional transistors 31–34 located therearound, thereby providing stronger protection than the protection against the inter-circuit signal wire 12.

Figure 12A:
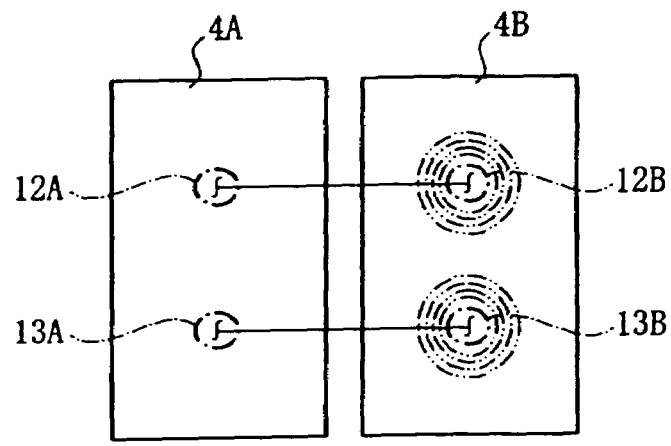
FIGS. 12A–12C illustrate adverse influences of surge noise.
Figure 12B:
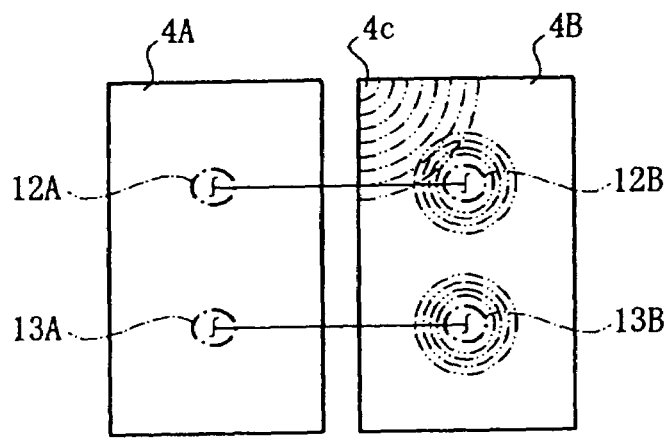
Figure 12C:
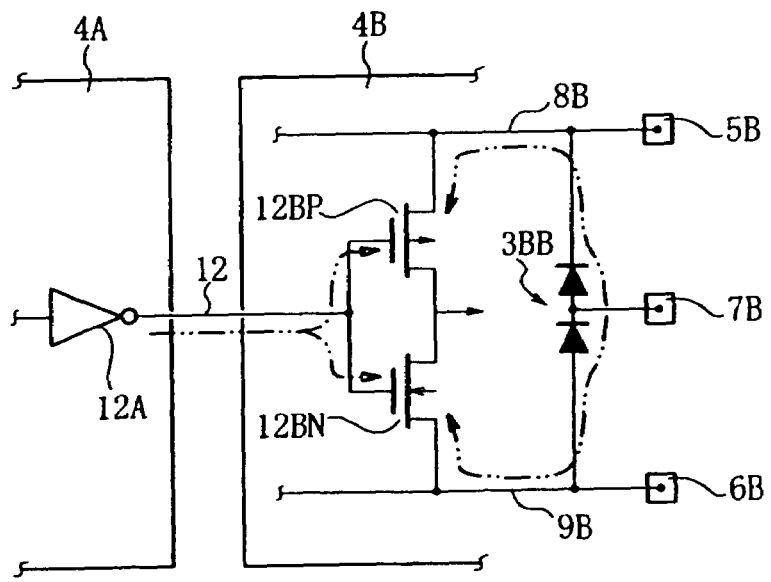

Consequently, the semiconductor integrated circuit device of the third embodiment can appropriately prevent electrostatic breakdown caused by surge noise or the like in a situation illustrated in FIG. 12C while maximally limiting an increase in circuit scale.

Fourth Embodiment

Next, a fourth embodiment of the semiconductor integrated circuit device according to the present invention will be described in terms of its specific configuration with reference to FIGS. 4A and 4B. FIG. 4A is a detailed circuit diagram of a main portion, and FIG. 4B illustrates the layout in the main portion.

The semiconductor integrated circuit device of the fourth embodiment differs from the foregoing second embodiment illustrated in FIGS. 2A, 2B in that an inter-circuit auxiliary wire 29 is introduced.

The inter-circuit auxiliary wire 29, which is provided for each inter-circuit signal wire 12, is routed along the inter-circuit signal wire 12 to match transmission conditions including a propagation delay time and so on between the two wires. Therefore, the inter-circuit auxiliary wire 29 runs in parallel with the inter-circuit signal wire 12.

The inter-circuit auxiliary wire 29 has one end connected directly to the source of the pMOS transistor 12AP in the internal circuit 4A (see FIG. 4B). This source region is a partial region connected to the power line 8A in the internal circuit 4A in the active element 12AP on the transmission side within the active elements in the first connection configuration connected to the inter-circuit signal wire 12, and can be said to be a static area near a connection to the inter-circuit signal wire.

With the introduction of the inter-circuit auxiliary wire 29, nMOS transistors 26, 28 have their drains connected to the inter-circuit auxiliary wire 29 instead of the inter-circuit signal wire 12. Specifically, the inter-circuit auxiliary wire 29 has the other end connected to the transistors 26, 28 in the internal circuit 4B. With such connections, the transistors 26, 28 act as active elements in a fourth connection configuration having the identical or similar structure to the active element 12BN in a first connection configuration on the reception side of signal transmission, are positioned near the active element 12BN, and are isolated from signal wires other than the inter-circuit auxiliary wire 29. It can therefore be said that these are also static areas.

Further, with the introduction of the inter-circuit auxiliary wire 29, the pMOS transistor 21 and the nMOS transistor 22, described in the first embodiment illustrated in FIGS. 1A to 1C, are again used in the internal circuit 4A. These transistors are connected in a manner similar to the first embodiment, and act as active elements in the second connection configuration positioned near the input element 12B.

In this circuit configuration, any of the inter-circuit auxiliary wire 29 and the nMOS transistors 26, 28 is not connected to signal wires in the internal circuits 4A, 4B, and the nMOS transistors 26, 28 will not become conductive as long as the voltage on the power line 8A and the voltage on the power line 9A are not inverted or excessively separated, so that the introduction of the inter-circuit auxiliary wire 29 will not damage proper operations of the internal circuits 4A, 4B. In addition, since the nMOS transistors 26, 28 and so on are isolated from the inter-circuit signal wire 12, signals on the inter-circuit signal wire 12 will not be delayed or reduced, the semiconductor integrated circuit device of the fourth embodiment provides preferred performance, and moreover can be readily applied even to applications which require fast operations. For surge noise which may vary in propagation speed on the power lines 8B, 9B as set forth above, the active elements 25, 27 in the second connection configuration act to disperse and mitigate the surge noise. In addition, the inter-circuit auxiliary wire 29 and so on act on surge dispersed near the input element 12B or surge noise which may collectively vary the potentials in a zone including the input element 12B within the internal circuit 4B, if any, in the following manner.

Specifically, an abnormally varying potential near the active element 12BN in the first connection configuration will be transferred to the source of the active element 12AP in the first connection configuration within the internal circuit 4A through the active elements 26, 28 in the fourth connection configuration and the inter-circuit auxiliary wire 29, and also propagates to the drain of the active element 12AP due to its parasitic capacitance or the like. Since the drain is connected to the inter-circuit signal wire 12, the varying potential returns to the gates of the active elements 12BN, 12BP in the first connection configuration, while it is attenuating.

In this way, a potential difference between the gate and the source of the input element 12B caused by the surge noise can be reduced or mitigated.

Also, the active elements 21, 22 in the second connection configuration within the internal circuit 4A, in addition to mitigating surge noise directly introduced into the internal circuit 4A in a manner similar to the active elements 25, 27 in the second connection configuration, disperse secondary potential variations caused by the source of the active element 12AP in the first connection configuration to a neighborhood of the output element 12A with the aid of the inter-circuit auxiliary wire 29, as described above, to directly protect the output element 12A as well as to indirectly protect the input element 12B.

It should be noted that while a larger number of the active elements in the second connection configuration should be provided near the active element 12A in the first connection configuration in the internal circuit 4A from a viewpoint of enhanced protection capability, they do not directly contribute to applications, so that only two of such active elements are provided in the internal circuit 4A for the trade-off with limitation to an increase in circuit scale.

As described above, the semiconductor integrated circuit device of the fourth embodiment can appropriately prevent electrostatic breakdown caused by the surge noise in the situations illustrated in FIGS. 12A, 12B as well as in FIG. 12C while maximally limiting an increase in circuit scale.

Fifth Embodiment

Next, a fifth embodiment of the semiconductor integrated circuit device according to the present invention will be described with reference to FIGS. 5A and 5B. FIG. 5A is a detailed circuit diagram of a main portion, and FIG. 5B illustrates the layout in the main portion.

The semiconductor integrated circuit device of the fifth embodiment differs from the fourth embodiment illustrated in FIGS. 4A and 4B in that the inter-circuit auxiliary wire 29 has its end near the output element 12A connected to the power line 8A instead of the source of the active element 12AP in the first connection configuration.

Specifically, as a location for the power line 8A connected to the inter-circuit auxiliary wire 29, selection is made to an upper portion of a source region of the pMOS transistor 12AP, functioning as an active element in the first connection configuration (see FIG. 5B). If this location is not available, selection is made to any location in an upper portion of a region occupied by the pMOS transistor 12AP. If even this location is not available, selection is made to any location in an upper portion of the basic cell region to which the pMOS transistor 12AP is allocated. The connecting location of the inter-circuit auxiliary wire 29 selected in this way lies within a neighboring region overlapping or close to the source region (partial region) in the power line 8A.

In the fifth embodiment, the pMOS transistor 12AP also has the source connected to the power line 8A, and the connection is usually made at a location where the source region of the pMOS transistor 12AP overlaps with the power line 8A or is extremely close to the power line 8A, so that the fifth embodiment is substantially identical to the fourth embodiment in which the inter-circuit auxiliary wire 29 is directly connected to the source of the active element 12AP in the first connection configuration in the propagation of surge noise between the inter-circuit auxiliary wire 29 and the active element 12AP in the first connection configuration, and so on.

Sixth Embodiment

Next, a sixth embodiment of the semiconductor integrated circuit device according to the present invention will be described in terms of its specific configuration with reference to FIG. 6 which illustrates a circuit diagram of a main portion.

The semiconductor integrated circuit device of the sixth embodiment differs from the fifth embodiment in that the former is explicitly provided additionally with an inter-circuit signal wire 13 on which signals are sent and received in the reverse directions to the inter-circuit signal wire 12, and similar protection measures are taken likewise for this inter-circuit signal wire 13 with an inter-circuit auxiliary wire 39 and so on.

Specifically, the inter-circuit auxiliary wire 39 extends from the source of the active element 13BP in the first connection configuration of the output element 13B on the transmission side of the inter-circuit signal wire 13 within the internal circuit 4B to the internal circuit 4A along the inter-circuit signal wire 13. Also, within the internal circuit 4B, a pMOS transistor 35 and an nMOS transistor 36, connected as active elements in the second connection configuration identical to the aforementioned protection transistors 21, 22, are provided near the active elements 13BP, 13BN in the first connection configuration. Within the internal circuit 4A, on the other hand, four MOS transistors 31–34 are provided as protective elements near the active element 13A in the first connection configuration on the reception side of the inter-circuit signal wire 13.

Within the four MOS transistors, the transistors 31, 33 are pMOS transistors having the same structure as the associated active element 13AP in the first connection configuration, and are positioned on the left and right sides of the active element 13AP in the first connection configuration. The transistors 32, 34 in turn are nMOS transistors having the same structure as the associated active element 13AN in the first connection configuration, and are positioned on the left and right sides of the active element 13AN in the first connection configuration. Also, all of the transistors 31–34 have their sources and gates connected to the power line 8A in the internal circuit 4A, and their drains connected to the inter-circuit auxiliary wire 39, but are not connected to other signal wires, so that they function as active elements in the fourth connection configuration for protecting the active elements 13AP, 13AN in the first configuration from the surroundings. In this way, the semiconductor integrated circuit device of the sixth embodiment does not comprise any active element in the second connection configuration but merely comprises a plurality of active elements in the fourth connection configuration near the active element 13A in the first connection configuration on the reception side of the inter-circuit signal wire 13. It should be noted that an active element in the second connection configuration and an active element in the fourth connection configuration are arranged in combination near the active element 12B in the first connection configuration on the reception side of the inter-circuit signal wire 12, as is the case of the aforementioned embodiment.

With this configuration, the internal circuits 4A, 4B are protected from electrostatic breakdown related to the inter-circuit wire 12 and the inter-circuit auxiliary wire 29 in a manner similar to the aforementioned embodiments. Also, with respect to the inter-circuit signal wire 13 and the inter-circuit auxiliary wire 39, the NMOS transistors 32, 34 will not become conductive as long as the voltage on the power line 8B and the voltage on the power line 9A are not inverted or excessively separated, as is the case of the aforementioned nMOS transistors 26, 28. Similarly, the pMOS transistors 31, 33 will not become conductive as long as the voltage on the power line 8B and the voltage on the power line 8A are not inverted or excessively separated. For this reason, the introduction of the inter-circuit auxiliary wire 39 will not damage proper operations of the internal circuits 4A, 4B. In addition, since the transistors 31–36 are all isolated from the inter-circuit signal wire 13, signals on the inter-circuit signal wire 13 will not be delayed or reduced.

Thus, the input element 13A is positively protected against the inter-circuit signal wire 13 by all of the four additional transistors 31–34 located therearound, thereby providing stronger protection than the protection against the inter-circuit signal wire 12.

Consequently, the semiconductor integrated circuit device of the sixth embodiment can appropriately prevent electrostatic breakdown caused by surge noise or the like in all the situations illustrated in FIGS. 12A to 12C while maximally limiting an increase in circuit scale.

Seventh Embodiment

Next, a seventh embodiment of the semiconductor integrated circuit device according to the present invention will be described in terms of its specific configuration with reference to FIGS. 7 to 9. This semiconductor integrated circuit device 1 (see FIG. 7) is also formed by CMOS-based large scaled integrated circuits on a single chip in a basic structure similar to the aforementioned embodiments. In the seventh embodiment, however, the internal-circuit signal line 12 may or may not be provided, whereas the existence of a branched wire 45B or a branched wire 45A has an important meaning.

Specifically, while external connection terminals 2 such as bonding pads, external signal input/output circuits and internal circuits are arranged in order from the periphery to the center of the device 1. An internal circuit 4A and an internal circuit 4B separately located on the left and right sides are fed with different supply voltages, for example, five volts and three volts, respectively, so that two separate input/output circuits 3A, 3B are provided on the left and right sides, respectively, and a pair of power lines 8A, 9A are routed for a set of the input/output circuit 3A and the internal circuit 4A, while a pair of power lines 8B, 9B are routed for a set of the input/output circuit 3B and the internal circuit 4B.

A large number of external connection terminals 2 are likewise divided into the left and right sides and allocated to the respective sets, wherein the power line 8A is connected to a high power terminal 5A, the power line 9A is connected to a ground terminal 6A, the power line 8B is connected to a low power terminal 5B, and the power line 9B is connected to a ground terminal 6B. The remaining external connection terminals 2 are assigned to appropriate external signal input/output signals, and connected to associated signal wires which extend to the internal circuits of the same sets through the associated input/output circuits. For example, a signal wire 44A connected to the input/output terminal 7A passes through the input/output circuit 3A and reaches the internal element 41A in the internal circuit 4A belonging to the same set as the input/output circuit 3A. A signal wire 44B connected to the input/output terminal 7B in turn passes through the input/output circuit 3B and reaches the internal element 41B in the internal circuit 4B belonging to the same set as the input/output circuit 3B.

For the signal wire 44A, a first protection circuit 3XA is provided in the input/output circuit 3A, and the branched wire 45B is branched from the first protection circuit 3XA. The branched wire 45B, after branched, extends separately from the set of the input/output circuit 3A and the internal circuit 4A, and once passes through the input/output circuit 3B in the other set. Eventually, the branched wire 45B reaches the internal circuit 4B of the same set, and is connected to an input element 42B in the internal circuit 4B. For the branched wire 45B, a second protection circuit 43B is provided in the input/output circuit 3B, and a third protection circuit comprising components 53–56 is provided near the input element 42B in the internal circuit 4B.

Similarly, for a signal wire 44B, a first protection circuit 3XB is provided in the input/output circuit 3B, and a branched wire 45A branched from the protection circuit 3XB extends separately from the set of the input/output circuit 3B and the internal circuit 4B. The branched wire 45A passes through the input/output circuit 3A in the other set, reaches the internal circuit 4A in the same set, and is connected to an input element 42A. For this branched wire 45A, a second protection circuit 43A is provided in the input/output circuit 3A, and third protection circuit comprising components 63–66 is provided near the input element 42A in the internal circuit 4A.

The first protection circuit 3XA (see FIG. 9) is composed of a diode D1 having a cathode connected to the power line 8A and an anode connected to the signal wire 44A; a diode D2 having a cathode connected to the signal wire 44A and an anode connected to the power line 9A; and a first protection element 51 implemented by a pMOS transistor (active element) having a source and a gate connected to the power line 8A and a drain connected to the power line 9A. These components are positioned close to one another. Likewise, the first protection circuit 3XB is composed of similar diodes D4, D5 and first protection element 61 (active element), similarly connected to the power lines 8B, 9B and the signal wire 44B, which are positioned close to one another.

The second protection circuit 43A is composed of a diode D6 having a cathode connected to the power line 8A and an anode connected to the branched wire 45A; a diode D7 having a cathode connected to the branched wire 45A and an anode connected to the power line 9A; and a second protection element 62 implemented by a pMOS transistor (active element) having a source and a gate connected to the power line 8A and a drain connected to the power line 9A. These components are positioned in close proximity to one another. Likewise, the second protection circuit 43B is composed of similar diode D3 and second protection element 52 (active element), similarly connected to the power lines 8B, 9B and the branched wire 45B, which are positioned close to one another. However, no diode is provided between the branched wire 45B and the power line 8B because a voltage on the branched wire 45B can be higher than a voltage on the power line 8B in a normally operating state.

Further, the input element 42A is composed of a pair of transistors 42AP, 42AN having their drains connected to each other. The transistor 42AP has a source connected to the power line 8A, while the transistor 42AN has a source connected to the power line 9A, and their gates are connected to the branched wire 45A. Then, the third protection circuit 63–66 for the input element 42A comprises third protection elements 63, 65, each of which is a pMOS transistor (active element) having a source and a gate connected to the power line 8A, and a drain connected to a branched wire 45A, and third protection elements 64, 66, each of which is an nMOS transistor (active element) having a source, and a gate connected to a power line 9A and a drain connected to the branched wire 45A.

Likewise, the input element 42B is composed of a pair of similar transistors 42BP, 42BN respectively connected to the power lines 8B, 9B and the branched wire 45B in a similar manner. The third protection circuit 53–56 for the input element 42B comprises four third protection elements 53, 54, 55, 56, wherein the third protection elements 54, 56 implemented by nMOS transistors (active elements) have their sources and gates connected to the power line 9B and drains connected to the branched wire 45B, as is the case of the third protection elements 64, 66, while the third protection elements 53, 55 implemented by pMOS transistors (active elements) have their drains connected to the power line 9B, neither to the branched wire 45B nor to other signal wires, unlike the third protection elements 63, 65, in order to avoid conduction in a normally operating state. The third protection elements 53, 55 have their sources and gates connected to the power line 8B.

As described above, the first protection elements 51,61 included in the first protection circuits 3XA, 3XB; the second protection elements 52, 62 included in the second protection circuits 43A, 43B; and the pMOS transistors 53, 55 of the third protection elements included in the third protection circuit 53–56 are all connected to the power lines of the input/output circuits or the internal circuits associated therewith, but are not connected to any signal wires including the branched wires 45A, 45B and therefore isolated.

Also, since an element to be protected is sandwiched on both sides by a plurality of protection elements included in the third protection circuit, the transistor 53 is positioned on the left side of the transistor 42BP; the transistor 55 is positioned on the right side of the same; the transistor 54 is positioned on the left side of the transistor 42BN; and the transistor 56 is positioned on the right side of the same, near the input element 42B. Similarly, near the input element 42A, the transistor 65 is positioned on the left side of the transistor 42AP; the transistor 63 is positioned on the right side of the same; the transistor 66 is positioned on the left side of the transistor 42AN; and the transistor 64 is positioned on the right side of the same.

For fabricating such circuits on a silicon wafer, generally, miniature basic cells for active elements are repeatedly arranged at regular pitches in the vertical and horizontal directions in regions allocated to the internal circuits 4A, 4B in each chip. In this way, the basic cells for active elements are regularly arranged in the same structure or similar structure until the midway of pre-processing of the semiconductor process to provide highly generalized wafers. As the allocation of active elements is specifically determined based on a particular application, a variety of demands are rapidly responded by providing appropriate metal wiring and so on. In this event, the same basic cells as the foregoing are frequently used (see FIG. 8A).

When a specific allocation of active elements has been determined, a pair of transistors 42BP, 42BN, for example, are allocated to adjacent basic cells in the internal circuit 4B. Subsequently, the third protection elements 53, 54 are allocated to adjacent basic cells on the left side of the respective transistors 42BP, 42BN, while the third protection elements 55, 56 are allocated to adjacent basic cells on the right side of the respective transistors 42BP, 42BN, and necessary wires associated with these elements are substantially uniquely determined. Specifically, respective basic cells of interest are formed with contact holes (represented by black circles in FIG. 8A) such as via holes on the centers of the cells, through which the sources of the transistors 42BP, 42BN and the third protection elements 53, 54, 55, 56 are connected to the power lines 8B, 9B, respectively. Also, for the drains and gates of the respective transistors, the aforementioned connections are established by metal wires (represented by thick lines in FIG. 8A).

In the semiconductor integrated circuit device configured as described, the MOS transistors 51, 52, 53, 55, 61, 62, though connected between the power line pairs 8A+9A, 8B+9B, have their sources and gates connected, so that these MOS transistors will not become conductive in a normally operating state, thus exerting no influence on the supply voltages or the operations of the input elements 42A, 42B. Likewise, while the MOS transistors 54, 56, 63, 64, 65, 66 have their drains connected to the branched wires 45A, 45B, they will not become conductive in a normally operating state and therefore will not affect proper operations of the input elements and so on as well as the supply voltages.

It should be noted however that due to the nature of active element, these MOS transistors have parasitic capacitance, though very little, in active regions such as pn junctions, so that instantaneous noise or the like can be passed in both directions to some degree. Further, also in the protection elements provided in the basic cells of this embodiment (for example, see the NMOS transistor 55 in FIG. 8B), recognition is given to the existence of a parasitic diode ($55d$) which becomes conductive to begin operating in response to the drain attempting to swing abnormally to the negative side, and a parasitic transistor ($55t$) which becomes conductive to begin operating in response to the drain jumping abnormally deep into the positive side.

The MOS transistors will become conductive if instantaneous noise, impossible in a normally operating state, is applied, or if the source-drain voltage is inverted or abnormally separated.

The diodes D1–D7 in turn are isolated from the power line 8B and the branched wire 45B, so that these diodes will not affect the supply voltages or proper operations of the input elements and so on in the normally operating state.

The diodes, however, become conductive if supply voltages at their connected locations are inverted, or if associated signal voltages and supply voltages are inverted.

For this reason, ESD surge (surge noise) entering, for example, from the input/output terminal 7A is first forced to escape to the power lines 8A, 9A by the conductive diodes D1, D2 in the first protection circuit 3XA. In this event, if the ESD surge flows more to one power line to produce an unbalanced state, the protection element 51 also become conductive to disperse the ESD surge uniformly between the power lines 8A, 9A. As a result the ESD surge is attenuated. Next, as the ESD surge reaches the second protection circuit 43B through the branched wire 45B, the conductive diode D3 forces the ESD surge to escape to the power line 9B, and the conductive protection element 52 also disperses the ESD surge to the power line 8B, so that the ESD surge is also attenuated on this route.

The still survival ESD surge reaches the input element 42B further through the branched wire 45B, where the third protection elements 54, 56 force the ESD surge to escape to the power line 9B, and the conductive third protection elements 53, 55 disperses the ESD surge to the power line 8B, so that the ESD surge is further attenuated. Moreover, since the ESD surge propagates immediately to the sources of the transistors 42BP, 42BN from both sides, large changes in the potential on the branched wire 45B and the gate potentials of the transistors 42BP, 42BN cause their source potentials to promptly change in the same direction by a certain amount as if they follows these changes. Thus, the difference in the gate-to-source potential between these transistors is further prevented from extending.

In this way, even the input element 42B, which has been difficult to protect due to the noise incoming through the input/output circuit 3A having a different power system, is reliably protected from electrostatic breakdown.

The input element 42A is also protected by a multi-stage structure comprised of the first protection circuit 3XB, the second protection circuit 43A and the third protection circuit 63–66 from ESD surge coming through the input/output terminal 7B substantially in a similar manner. The input element 42A, however, is more reliably protected since the inversion of the voltages on the branched wire 45A and the power line 8A is directly mitigated by the existence of the diode D6, the third protection elements 63, 66 having the drains connected to different locations, and so on.

Also, even if surge noise introduced into any other external output terminal 2, which is not connected to the branched wire 45A or 45B, causes a sudden change in the voltages on the power lines 8A, 9A, 8B, 9B associated with the input elements 42A, 42B to begin increasing the potential differences across the sources and gates of the transistors 42AP, 42AN, 42BP, 42BN of the input elements 42A, 42B, the third protection circuits 53–56, 63–66 promptly disperse and mitigate the potential differences at least in and around these regions. Consequently, the peak of the potential differences is suppressed.

In this way, the internal circuits are reliably protected from electrostatic breakdown due to surge noise entering from any external connection terminal 2.

Other Supplements

While the foregoing embodiments have been described in connection with the internal circuits composed of CMOS elements, this is a mere example, and the present invention can be applied to any internal circuits composed of FETs of pMOS, nMOS, other NMOS, or the like. Also, the internal circuits may contain bipolar transistors and may be digital circuits or analog circuits.

The number of internal circuits is not limited to two, and three or more internal circuits may be provided. The layout of the internal circuits are not limited to the side-by-side arrangement, and any arbitrary arrangement may be made.

The power lines are not either limited to a pair of a positive voltage applying line and a ground line as described above, but may be a variety of combinations such as a pair of positive and negative voltage applying lines, a set of a positive voltage line, a negative voltage line and a ground line, a set of a higher voltage line, a lower voltage line and another reference voltage line, and so on.

Further, for convenience of illustration, active elements in the internal circuits are shown only in two rows and one column and in two lines and three columns. These active elements, however, are only a portion of the internal circuits. Generally, an internal circuit is composed of a more number of active elements arranged in a matrix of multiple lines and multiple columns.

As to the inter-circuit signal wires, the semiconductor integrated circuit device may have only the inter-circuit signal wire 12, or only the inter-circuit signal wire 13, or a plurality of the inter-circuit signal wires 12 or the inter-circuit signal wires 13. The number of inter-circuit signal wires will never hinder the application of the present invention.

Also, while a p-type substrate has been mentioned in the foregoing embodiments, the substrate is not limited to the p-type but may be n-type or an insulating substrate, and is not limited to silicon but may be gallium arsenide (GaAs).

While in the foregoing embodiments, the basic cell is composed of a set of two transistors, the basic cell is not limited to this particular configuration, but may be composed of only one transistor or more than two transistors.

Since the present invention is not provided on the assumption that conventional input protection circuits and inter-block protection circuits are eliminated, the present invention may be applied after these conventional protection circuits are removed, or may be applied together with such protection circuits.

CONCLUSION OF THE INVENTION

As will be apparent from the foregoing descriptions, a semiconductor integrated circuit device according to a first aspect of the invention of the present invention promptly and uniformly disperses fluctuations in potentials due to surge noise near an active element in the first connection configuration to suppress the peak of the fluctuations, and newly introduced protection elements are implemented in a procedure similar to that of the active elements in the first connection configuration, and so on, thereby making it possible to realize a semiconductor integrated circuit device which is resistant to electrostatic breakdown and suitable to automatic designing and so on.

Also, a semiconductor integrated circuit device according to a second aspect of the invention of the present invention promptly disperses fluctuations in potential due to surge noise near an active element in the first connection configuration to suppress the peak of the fluctuations, and newly introduced protection elements in the second connection configuration are implemented in a procedure similar to that of the active elements in the first connection configuration, and so on, and moreover act as protection elements irrespective of the magnitude of supply voltage, thereby making it possible to realize a semiconductor integrated circuit device which is more resistant to electrostatic breakdown and suitable to automatic designing and so on.

Further, a semiconductor integrated circuit device according to a third aspect of the invention of the present invention introduces active elements in a third connection configuration which positively disperse the influence of an inter-circuit signal wire and which is implemented in a procedure similar to those of the active elements in the first and second connection configurations, thereby making it possible to realize a semiconductor integrated circuit device which is more resistant to electrostatic breakdown and suitable to automatic designing and so on.

Further, a semiconductor integrated circuit device according to a fourth aspect of the invention of the present invention employs many active elements in the third connection configuration positioned on a reception side of an internal circuit, which is more vulnerable to the influence on an inter-circuit signal wire, for positively distributing the influence of the inter-circuit signal wire, thereby making it possible to realize a semiconductor integrated circuit device which is more resistant to electrostatic breakdown and suitable to automatic designing and so on.

Further, in a semiconductor integrated circuit device according to a fifth aspect of the invention of the present invention, local potential fluctuations caused by the inter-circuit signal wire and the inter-circuit auxiliary wire are superimposed to suppress the peak of potential differences generated in the active elements in the first connection configuration, and the new protection circuits can be introduced by additionally changing associated wiring patterns, thereby making it possible to realize a semiconductor integrated circuit device which is resistant to electrostatic breakdown and suitable to automatic designing and so on.

Further, a semiconductor integrated circuit device according to a sixth aspect of the invention of the present invention disperses the influence of the inter-circuit signal wire exerted to the reception side, which is relatively vulnerable, toward the transmission side, which is relatively strong, thereby making it possible to realize a semiconductor integrated circuit device which is more resistant to electrostatic breakdown and suitable to automatic designing and so on.

Further, a semiconductor integrated circuit device according to a seventh aspect of the invention relieves restrictions related to a location at which the inter-circuit auxiliary wire is connected, thereby making it possible to realize a semiconductor integrated circuit device which is more resistant to electrostatic breakdown and more suitable to automatic designing and so on.

Further, a semiconductor integrated circuit device according to an eighth aspect of the invention uses many active elements in the fourth connection configuration around the reception side, which is vulnerable to the influence of the inter-circuit signal wire, for positively distributing the influence of the inter-circuit signal line, thereby making it possible to realize a semiconductor integrated circuit device which is more resistant to electrostatic breakdown and suitable to automatic designing and so on.

Further, a semiconductor integrated circuit device according to a ninth aspect of the invention promptly and uniformly disperses potential fluctuations due to surge noise near active elements in the first connection configuration to limit the peak of the fluctuations, so that enhanced protection can be provided for the active elements in the first connection configuration, thereby making it possible to realize a semiconductor integrated circuit device which is resistant to electrostatic breakdown and suitable to automatic designing and so on.

Further, a semiconductor integrated circuit device according to a tenth aspect of the invention protects internal circuits, to which branched wires are routed, in the internal circuits themselves as well as in input/output circuits in the midway, to multiply explicit and direct protection in addition to supplementary protection in input/output circuits in another power system, thereby making it possible to enhance the protection of the internal circuits from electrostatic breakdown.

Further, a semiconductor integrated circuit device according to an eleventh aspect of the invention can protect internal circuits even without direct connections to signal wires or branched wires, to ensure that a protection circuit can be provided even for an internal circuit connected to a circuit in another power system through a signal wire or a branched wire.

Further, a semiconductor integrated circuit device according to a twelfth aspect of the invention protects an element of interest from the surroundings, so that local fluctuations in potential difference around the element of interest, if any, will be dispersed to the surroundings to promptly limit the peak of the potential difference, thereby making it possible to further enhance the protection of internal circuits from electrostatic breakdown.

The invention claimed is:

1. A semiconductor integrated circuit device comprising:
at least two internal circuits arranged internally in a circuit forming region, each of said two internal circuits having a different pair of power lines;
a first and a second inter-circuit signal wires, different from said power lines, arranged to interconnect said two internal circuits;
a first transistor on a reception side of said first inter-circuit signal wire and connected to said first inter-circuit signal wire, in a first one of said two internal circuits;
a plurality of second transistors, for protecting said first transistor, being arranged adjacent to said first transistor in said first one of said two internal circuits and including a transistor of an identical structure to said first transistor;
a third transistor on a reception side of said second inter-circuit signal wire and connected to said second inter-circuit signal wire, in a second one of said two internal circuits;
a plurality of fourth transistors, for protecting said third transistor, being arranged adjacent to said third transistor in the said second one of said two internal circuits and including a transistor of an identical structure to said third transistor;
a first inter-circuit auxiliary wire, different from said power lines, connected to a first static area near a location on a transmission side, at which said first inter-circuit signal wire is connected, and to said plurality of second transistors; and
a second inter-circuit auxiliary wire, different from said power lines, connected to a second static area near a location on a transmission side, at which said second inter-circuit signal wire is connected, and to said plurality of fourth transistors.

2. A semiconductor integrated circuit device according to claim 1, wherein said plurality of second transistors are arranged to sandwich or surround said first transistor, and said plurality of fourth transistors are arranged to sandwich or surround said third transistor.

3. A semiconductor integrated circuit device according to claim 1, wherein each of said internal circuits includes a multiplicity of basic cells regularly arranged in repetition, and said first transistor, said plurality of second transistors, said third transistor and said plurality of fourth transistors are allocated to some of said basic cells.

4. A semiconductor integrated circuit device according to claim 1, further comprising a substrate formed in a single chip, and said circuit forming region is allocated to one surface of said substrate.

5. A semiconductor integrated circuit device according to claim 4, wherein said circuit forming region includes signal input/output circuits outside said internal circuits, and external connection terminals outside said input/output circuits.

6. A semiconductor integrated circuit device according to claim 1, wherein said first static area is connected to one of a pair of power lines in said second one of said internal circuits, and said second static area is connected to one of a pair of power lines in said first one of said two internal circuits.

7. A semiconductor integrated circuit device according to claim 6, wherein said first transistor, said transistor of an identical structure to said first transistor, said third transistor, said transistor of an identical structure to said third transistor are n-type MOS transistors.

8. A semiconductor integrated circuit device according to claim 6, wherein a drain of said transistor of an identical structure to said first transistor is connected to said first inter-circuit auxiliary wire, and a drain of said transistor of an identical structure to said third transistor is connected to said second inter-circuit auxiliary wire.

9. A semiconductor integrated circuit device according to claim 6, wherein a pair of power lines in each of said two internal circuits are a power line for applying a positive voltage and a power for grounding.

10. A semiconductor integrated circuit device according to claim 9, wherein the positive voltage applied in said first one of said two internal circuits is lower than the positive voltage applies in said second one of said two internal circuits.

11. A semiconductor integrated circuit device comprising:
at least a first and a second internal circuits arranged internally in a circuit forming region, each of said first and second internal circuits having a different pair of power lines;
at least a first and a second input/output circuits arranged outside said internal circuits, each of said first and second input/output circuits having a different pair of power lines;
a plurality of external connection terminals outside said input/output circuits;
a signal wire from one of said external connection terminals passing through said first input/output circuit and reaching said first internal circuit having the same pair of power lines as said first input/output circuit;
a branched wire branched from said signal wire and passing through said second input/output circuit, and reaching said second internal circuit having the same pair of power lines as said second input/output circuit;
a first protection circuit arranged in said first input/output circuit for said signal wire;
a second protection circuit arranged in said second input/output circuit for said branched wire; and
a third protection circuit arranged in said second internal circuit for said branched wire.

12. A semiconductor integrated circuit device according to claim 11, wherein each of said internal circuits includes a multiplicity of basic cells for active elements regularly arranged in repetition.

13. A semiconductor integrated circuit device according to claim 11, further comprising a substrate formed in a single chip, and said circuit forming region is allocated to one surface of said substrate.

14. A semiconductor integrated circuit device according to claim 11, wherein said third protection circuit includes a plurality of protection elements, said protection elements being arranged to sandwich or surround an element to be protected.

15. A semiconductor integrated circuit device according to claim 11, wherein either of said first, second or third protection circuit includes an active element connected to a power line of an associated input/output circuit or an associated internal circuit, and isolated from any signal wire.

16. A semiconductor integrated circuit device according to claim 15, wherein said third protection circuit includes a plurality of protection elements, said protection elements being arranged to sandwich or surround an element to be protected.

* * * * *